United States Patent
Park et al.

(10) Patent No.: US 12,349,577 B2
(45) Date of Patent: Jul. 1, 2025

(54) DISPLAY DEVICE

(71) Applicant: SAMSUNG DISPLAY CO., LTD., Yongin-si (KR)

(72) Inventors: Hee Jean Park, Yongin-si (KR); Hee Rim Song, Yongin-si (KR); Mu Kyung Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/841,740

(22) Filed: Jun. 16, 2022

(65) Prior Publication Data

US 2023/0103841 A1    Apr. 6, 2023

(30) Foreign Application Priority Data

Oct. 1, 2021    (KR) .......................... 10-2021-0131172

(51) Int. Cl.
*G09G 3/3233*    (2016.01)
*H10K 59/65*    (2023.01)

(52) U.S. Cl.
CPC ........... *H10K 59/65* (2023.02); *G09G 3/3233* (2013.01); *G09G 2300/0426* (2013.01); *G09G 2300/0819* (2013.01); *G09G 2300/0842* (2013.01); *G09G 2330/02* (2013.01)

(58) Field of Classification Search
CPC ................. H10K 59/65; G09G 3/3233; G09G 2300/0426; G09G 2300/0819; G09G 2300/0842; G09G 2330/02
See application file for complete search history.

(56) References Cited

U.S. PATENT DOCUMENTS 6,747,638 B2    6/2004    Yamazaki et al.
6,825,492 B2 *  11/2004   Yonezawa ......... H01L 27/14689
                                                  257/53

(Continued)

FOREIGN PATENT DOCUMENTS

KR    10-2001-0083153    8/2001
KR    10-2019-0090241    8/2019
KR    10-2020-0040196    4/2020

OTHER PUBLICATIONS

International Search Report issued on Nov. 17, 2022 in corresponding International Application No. PCT/KR2022/011539.

*Primary Examiner* — Jeff Piziali
(74) *Attorney, Agent, or Firm* — F. CHAU & ASSOCIATES, LLC

(57) ABSTRACT

A display device including: a base layer; a backplane structure provided on the base layer and including a pixel circuit and a sensor circuit; a pixel layer provided on the backplane structure and including a light-emitting element connected to the pixel circuit and a light-receiving element connected to the sensor circuit; and an encapsulation layer covering the pixel layer, wherein the sensor circuit includes: a first sensor transistor and a second sensor transistor connected between a readout line and a sensing power line to which sensing power is supplied; and a third sensor transistor connected to the light-receiving element, wherein the sensing power line extends in a first direction, and wherein the backplane structure further includes a first connection pattern to connect the first sensor transistor and the second sensor transistor through first and second contact holes.

19 Claims, 14 Drawing Sheets

(56) References Cited

U.S. PATENT DOCUMENTS

| | | | |
|---|---|---|---|
| 7,351,605 B2 * | 4/2008 | Yonezawa | H01L 27/127 |
| | | | 438/57 |
| 7,768,007 B2 * | 8/2010 | Yamazaki | G06F 3/03545 |
| | | | 257/53 |
| 8,058,699 B2 * | 11/2011 | Yamazaki | H01L 29/78672 |
| | | | 257/431 |
| 9,450,133 B2 * | 9/2016 | Nakamura | H01L 31/1055 |
| 9,703,423 B2 * | 7/2017 | Kurokawa | G06F 3/042 |
| 9,916,793 B2 * | 3/2018 | Kozuma | G06F 3/0412 |
| 10,727,285 B2 | 7/2020 | Chung et al. | |
| 10,978,523 B2 | 4/2021 | Park et al. | |
| 2002/0011972 A1 * | 1/2002 | Yamazaki | H04N 3/155 |
| | | | 348/E3.018 |
| 2019/0051683 A1 | 2/2019 | Aoki et al. | |
| 2020/0091252 A1 * | 3/2020 | Bang | G06F 3/0446 |
| 2021/0151524 A1 | 5/2021 | Tang et al. | |

\* cited by examiner

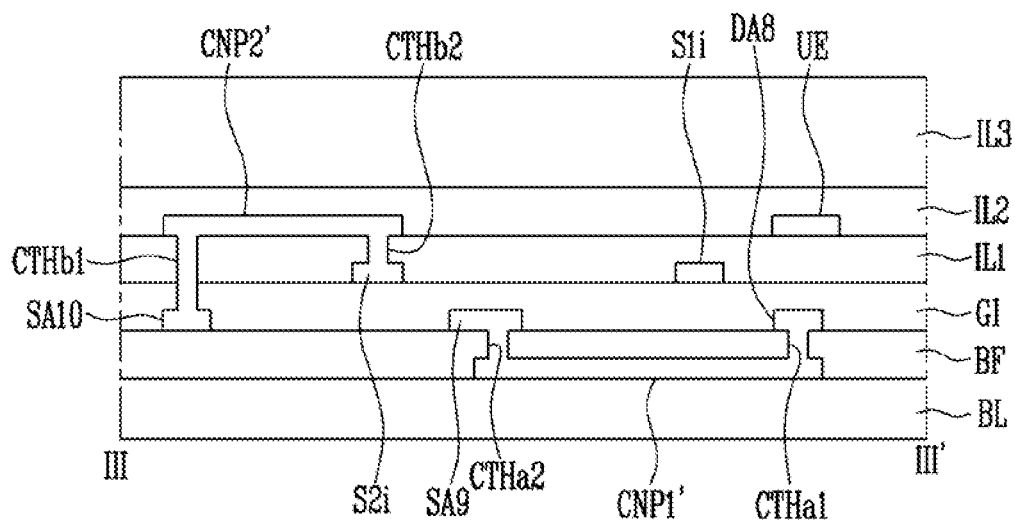
FIG. 11
FIG. 12
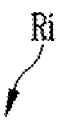
FIG. 13

DISPLAY DEVICE

CROSS-REFERENCE TO RELATED APPLICATION

This application claims priority under 35 U.S.C. § 119 to Korean Patent Application No. 10-2021-0131172 filed in the Korean Intellectual Property Office on Oct. 1, 2021, the disclosure of which is incorporated by reference herein in its entirety.

1. TECHNICAL FIELD

The present invention relates to a display device including an optical sensor.

2. DESCRIPTION OF THE RELATED ART

A display device is an output device for presentation of information in visual form. As demand for information display increases, display devices are being applied to various electronic devices such as smartphones, digital cameras, laptop computers, navigation devices, and smart televisions.

Techniques for combining and integrating a biometric sensor for recognizing a fingerprint or the like into a display panel of a display device are being researched and developed.

SUMMARY

Example embodiments of the present invention provide a display device including a light-receiving element coplanar with a light-emitting element of a pixel and a sensor circuit formed together with a pixel circuit in a manufacturing process.

According to example embodiments of the present invention, a display device including: a base layer; a backplane structure provided on the base layer and including a pixel circuit and a sensor circuit; a pixel layer provided on the backplane structure and including a light-emitting element connected to the pixel circuit and a light-receiving element connected to the sensor circuit; and an encapsulation layer covering the pixel layer, wherein the sensor circuit includes: a first sensor transistor and a second sensor transistor connected between a readout line and a sensing power line to which sensing power is supplied; and a third sensor transistor connected to the light-receiving element, wherein the sensing power line extends in a first direction, and wherein the backplane structure further includes a first connection pattern to connect the first sensor transistor and the second sensor transistor through first and second contact holes.

The backplane structure may further include: a semiconductor layer including an active pattern provided on the base layer; a first conductive layer including gate electrodes overlapping the active pattern with a gate insulating layer interposed therebetween; a first insulating layer covering the first conductive layer; a second conductive layer provided on the first insulating layer; and a second insulating layer covering the second conductive layer.

The second conductive layer may include the sensing power line and the readout line, and the readout line extends in the first direction.

The second conductive layer may further include an initialization power line which extends in the first direction and provides initialization power to the pixel circuit.

The first conductive layer may further include: a sensing scan line extending in the first direction from a gate electrode of the second sensor transistor; and a scan line connected to the pixel circuit and extending in the first direction.

The backplane structure may further include: a third conductive layer provided on the second insulating layer and connected to at least one of the semiconductor layer, the first conductive layer, and the second conductive layer through a contact hole.

The third conductive layer may include the first connection pattern extending in a second direction intersecting the first direction.

The third conductive layer may further include a second connection pattern connected to a previous sensing scan line and the third sensor transistor through third and fourth contact holes and extending in the second direction.

The second connection pattern may further be connected to a gate electrode of the second sensor transistor through a contact hole.

The third conductive layer may further include: a driving power line which extends in a second direction intersecting the first direction and provides a voltage of a driving power supply to the pixel circuit; and a data line which extends in the second direction and provides a data signal to the pixel circuit.

The backplane structure may further include: a lower conductive layer provided on the base layer; and a buffer layer provided between the lower conductive layer and the semiconductor layer to cover the lower conductive layer.

The lower conductive layer may include the first connection pattern extending in a second direction intersecting the first direction.

The first conductive layer may further include: a first scan line extending in the first direction and connected to a gate electrode of the third sensor transistor and the pixel circuit; and a second scan line extending in the first direction and connected to a gate electrode of the second sensor transistor and the pixel circuit.

The second conductive layer may include: a second connection pattern connected to the second scan line and the third sensor transistor through third and fourth contact holes and including a portion extending in the second direction.

A scan signal may be supplied to a gate electrode of the first sensor transistor and a first electrode of the third sensor transistor through the second scan line.

The pixel circuit may include: a first pixel transistor configured to receive a voltage of a driving power supply from a driving power line and generate a driving current to be supplied to the light-emitting element; a second pixel transistor connected between a data line and a first electrode of the first pixel transistor and including a gate electrode connected to a first scan line; a third pixel transistor connected between a gate electrode of the first pixel transistor and an initialization power line and including a gate electrode connected to a second scan line; and a fourth pixel transistor connected between a first electrode of the light-emitting element and the initialization power line and including a gate electrode connected to a third scan line, wherein the first scan line is connected to the gate electrode of the third sensor transistor and the gate electrode of the second pixel transistor.

The second scan line may be connected to the gate electrode of the second sensor transistor and the gate electrode of the third pixel transistor and is connected to a first electrode of the third sensor transistor through a second connection pattern.

In one pixel row, a ratio of the number of the pixel circuits to the number of the sensor circuits may be 1:1.

In one pixel row, a ratio of the number of the pixel circuits to the number of the sensor circuits may be 2:1.

According to example embodiments of the present invention, a display device includes: a base layer; a backplane structure provided on the base layer and including a pixel circuit and a sensor circuit; a pixel layer provided on the backplane structure and including a light-emitting element connected to the pixel circuit and a light-receiving element connected to the sensor circuit; and an encapsulation layer covering the pixel layer, wherein the sensor circuit includes: a first sensor transistor and a second sensor transistor connected between a readout line and a sensing power line to which sensing power is supplied; and a third sensor transistor connected to the light-receiving element, wherein the sensing power line and the readout line extend in a first direction, and wherein the backplane structure further includes a connection pattern which connects the first sensor transistor and the second sensor transistor and extends in a second direction intersecting the first direction.

BRIEF DESCRIPTION OF THE DRAWINGS

FIG. 11 is a cross-sectional view taken along line III-III' of FIG. 9.

FIG. 12 is a view illustrating an example of an arrangement of pixels and optical sensors included in the display device of FIG. 1.

FIG. 13 is a view illustrating an example of an arrangement of pixels and optical sensors included in the display device of FIG. 1.

DETAILED DESCRIPTION OF THE EMBODIMENTS

Hereinafter, embodiments of the present invention will be described in more detail with reference to the accompanying drawings. Like numbers may refer to like elements throughout the description of the figures, and the description of the same component may not be reiterated.

Figure 1:
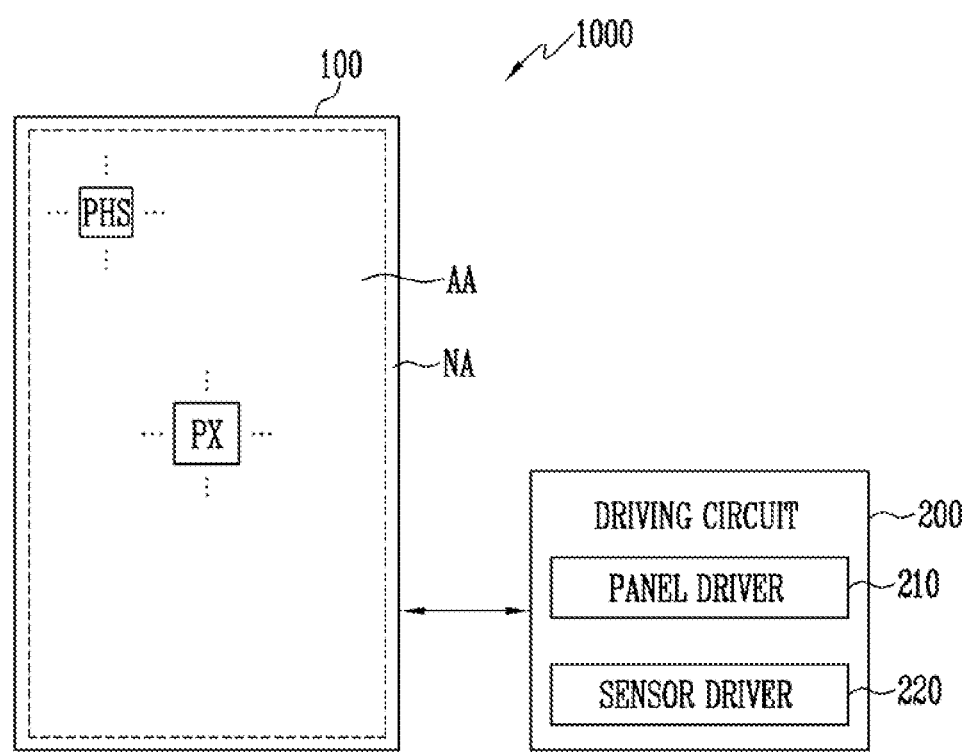
FIG. 1 is a block diagram illustrating a display device according to example embodiments of the present invention.

FIG. 1 is a block diagram illustrating a display device according to example embodiments of the present invention.

Referring to FIG. 1, a display device 1000 may include a display panel 100 and a driving circuit 200. In one embodiment of the present invention, the driving circuit 200 may include a panel driver 210 and a sensor driver 220.

The display device 1000 may be a self-luminous display device including a plurality of self-luminous elements. In particular, the display device 1000 may be an organic light-emitting display device including organic light-emitting elements. However, this is merely an example, and the display device 1000 may be a display device including inorganic light-emitting elements or a display device including light-emitting elements including an inorganic material and an organic material. Alternatively, the display device 1000 may be a liquid crystal display device, a plasma display device, a quantum dot display device, or the like.

The display device 1000 may be a flat display device, a flexible display device, a curved display device, a foldable display device, or a bendable display device. In addition, the display device 1000 may be applied to a transparent display device, a head-mounted display device, a wearable display device, or the like.

The display panel 100 includes a display area AA and a non-display area NA. The display area AA may be an area in which a plurality of pixels PX are provided. The pixels PX may be referred to as subpixels. Each of the pixels PX may include one or more light-emitting elements. For example, the light-emitting element may include a light-emitting layer (or an organic light-emitting layer). A portion through which light is emitted by the light-emitting element may be a light-emitting area. The display device 1000 may display an image in the display area AA by driving the pixels PX in response to image data input from an external source.

In one embodiment of the present invention, photo sensors PHS may be included in the display area AA. The photo sensors PHS may be referred to as sensor pixels. The photo sensor PHS may include a light-receiving element including a light-receiving layer. The photo sensors PHS may be interchangeably referred to as optical sensors PHS. In the display area AA, the light-receiving layer of the light-receiving element may be spaced apart from the light-emitting layer of the light-emitting element.

In one embodiment of the present invention, the plurality of optical sensors PHS may be spaced apart from each other over an entire area of the display area AA. However, this is merely an example, and only a portion of the display area AA may be set as a predetermined sensing area, and the optical sensors PHS may be provided in the sensing area. In addition, the optical sensors PHS may be included in at least a portion of the non-display area NA. In this case, only a portion of the non-display area NA may be set as a predetermined sensing area, and the optical sensors PHS may be provided in the sensing area.

In one embodiment of the present invention, the optical sensors PHS may detect light emitted from a light source (for example, the light-emitting element) that is reflected by an external object (for example, a user's finger or the like). For example, a user's fingerprint may be detected through the optical sensor PHS. Hereinafter, the present invention will be described with an example in which the optical sensors PHS are used for detecting a fingerprint, but in various embodiments, the optical sensors PHS may detect various pieces of biometric information about an iris, a vein, and the like of a user. In addition, the light sensor PHS may sense external light and may perform functions of a gesture sensor, a motion sensor, a proximity sensor, an illuminance sensor, and an image sensor.

The non-display area NA may be an area provided around the display area AA. The non-display area NA may surround four sides of the display area AA or less than four sides of the display area AA. In one embodiment of the present invention, the non-display area NA may collectively refer to the remaining area of the display panel 100 excluding the display area AA. For example, the non-display area NA may include a line area, a pad area, and various dummy areas.

The display device 1000 may include the panel driver 210 and the sensor driver 220. Although the panel driver 210 and the sensor driver 220 are illustrated as being separated from each other in FIG. 1, the present invention is not limited thereto. For example, at least a part of the sensor driving unit 220 may be included in the panel driver 210 or may operate in conjunction with the panel driver 210.

The panel driver 210 may scan the pixels PX of the display area AA and may provide a data signal corresponding to image data (or an image) to the pixels PX. The display panel 100 may supply an image corresponding to the data signal.

In one embodiment of the present invention, the panel driver 210 may supply a driving signal for sensing a fingerprint to the pixels PX. This driving signal may be supplied to cause the pixels PX to emit light to operate as a light source for the optical sensor PHS. In one embodiment of the present invention, the panel driver 210 may also supply the driving signal and/or another driving signal for sensing a fingerprint to the optical sensor PHS. However, this is merely an example, and driving signals for sensing a fingerprint may be supplied by the sensor driver 220.

The sensor driver 220 may detect biometric information about a user's fingerprint or the like based on detection signals received from the optical sensors PHS. In one embodiment of the present invention, the sensor driver 220 may supply the driving signals to the optical sensors PHS and/or the pixels PX.

Figure 2:
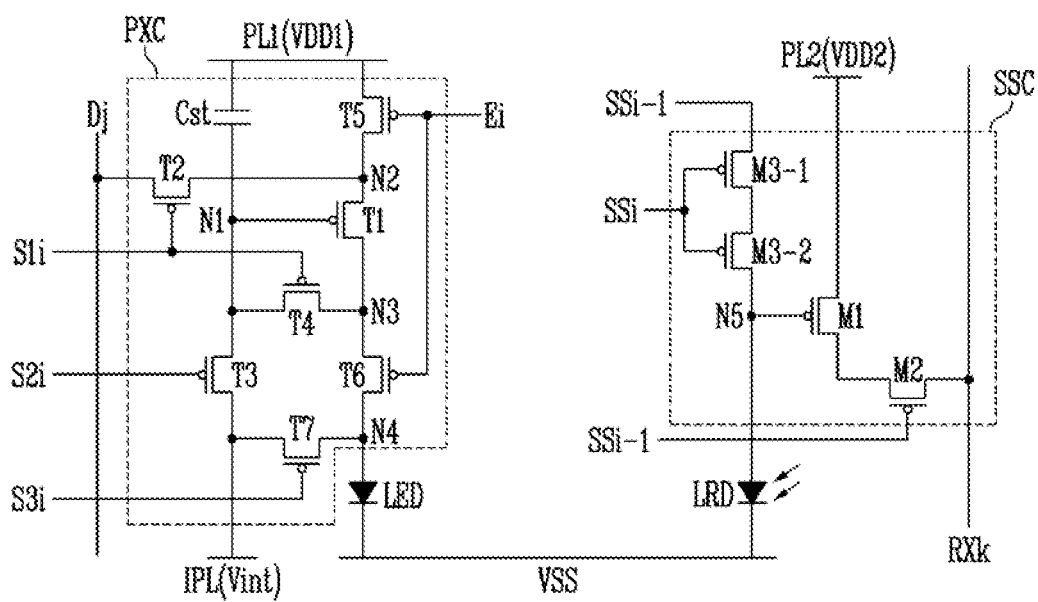
FIG. 2 is a circuit diagram illustrating an example of a pixel and an optical sensor included in the display device of FIG. 1.

FIG. 2 is a circuit diagram illustrating an example of a pixel and an optical sensor included in the display device of FIG. 1.

In FIG. 2, for convenience of description, a pixel PX positioned in an $i^{th}$ pixel row (or an $i^{th}$ horizontal line) and connected to a $j^{th}$ data line Dj and an optical sensor PHS positioned in the $i^{th}$ pixel row and connected to a $k^{th}$ readout line RXk are illustrated, wherein i, j, and k are natural numbers.

Referring to FIGS. 1 and 2, the pixel PX includes a pixel circuit PXC and a light-emitting element LED connected thereto, and the optical sensor PHS includes a sensor circuit SSC and a light-receiving element LRD connected thereto.

A first electrode (or a first pixel electrode) of the light-emitting element LED may be connected to a fourth node N4, and a second electrode (or a second pixel electrode) of the light-emitting element LED may be connected to a second power supply VSS. The light-emitting element LED may generate light having a predetermined luminance in response to an amount of current (e.g., a driving current) supplied from a first pixel transistor T1.

In one embodiment of the present invention, the light-emitting element LED may be an organic light-emitting diode including an organic light-emitting layer. In another embodiment of the present invention, the light-emitting element LED may be an inorganic light-emitting element made of an inorganic material. In still another embodiment of the present invention, the light-emitting element LED may be a light-emitting element including an inorganic material and an organic material in combination.

A first electrode (or a first sensor electrode) of the light-receiving element LRD may be connected to a fifth node N5, and a second electrode (or a second sensor electrode) of the light-receiving element LRD may be connected to the second power supply VSS. The light-receiving element LRD may generate carriers including free electrons and holes based on an intensity of light incident to the light-receiving layer and may generate a current (e.g., a photocurrent) caused by movement of the carriers.

The pixel circuit PXC may include the first pixel transistor T1, a second pixel transistor T2, a storage capacitor Cst, and the light-emitting element LED. In one embodiment of the present invention, the pixel circuit PXC may further include third, fourth, fifth, sixth and seventh pixel transistors T3, T4, T5, T6 and T7.

The first pixel transistor T1 (or a driving transistor) may be connected between a driving power line PL1, to which a voltage of a driving power supply VDD1 is applied, and the first electrode of the light-emitting element LED. The first pixel transistor T1 may include a gate electrode connected to a first node N1.

The first transistor T1 controls an amount of a current (e.g., a driving current) flowing from the driving power supply VDD1 to the second power supply VSS through the light-emitting element LD in response to a voltage of the first node N1. To accomplish this, a voltage of the driving power supply VDD1 may be set to be higher than that of the second power supply VSS.

The second pixel transistor T2 may be connected between a jth data line Dj (hereinafter, referred to as a data line) and a second node N2. A gate electrode of the second pixel transistor T2 may be connected to an $i^{th}$-first scan line S1i (hereinafter, referred to as a first scan line). When a first scan signal is supplied to the first scan line S1i, the second pixel transistor T2 may be turned on to electrically connect the data line Dj and the second node N2.

The third pixel transistor T3 may be connected between the first node N1 and an initialization power line IPL for transmitting a voltage of an initialization power supply Vint. For example, the third pixel transistor T3 may be connected to the gate electrode of the first pixel transistor T1 and the initialization power supply Vint. A gate electrode of the third pixel transistor T3 may be connected to an $i^{th}$-second scan line S2i (hereinafter, referred to as a second scan line). The third pixel transistor T3 may be turned on by a second scan signal supplied to the second scan line S2i. When the third pixel transistor T3 is turned on, a voltage of the initialization power supply Vint may be supplied to the first node N1 (in other words, the gate electrode of the first pixel transistor T1). In one embodiment of the present invention, a timing of the second scan signal supplied to the second scan line S2i may be the same as a timing of a scan signal supplied to an $(i-1)^{th}$-first scan line (for example, denoted by S1i−1).

The fourth pixel transistor T4 may be connected between the first node N1 and a third node N3. In other words, the fourth pixel transistor T4 may be connected to the gate electrode of the first pixel transistor T1 and the third node N3. A gate electrode of the fourth pixel transistor T4 may be connected to the first scan line S1$i$. The fourth pixel transistor T4 may be turned on simultaneously with the second pixel transistor T2.

The fifth pixel transistor T5 may be connected between the driving power line PL1 and the second node N2. A gate electrode of the fifth pixel transistor T5 may be connected to an $i^{th}$ emission control line Ei (hereinafter, referred to as an emission control line). The sixth pixel transistor T6 may be connected between the third node N3 and the light-emitting element LED (or the fourth node N4). For example, the sixth pixel transistor T6 may be connected to the first electrode of the light-emitting element LED. A gate electrode of the sixth transistor T6 may be connected to the emission control line Ei. The fifth pixel transistor T5 and the sixth pixel transistor T6 may be turned off when an emission control signal is supplied to the emission control line Ei and may be turned on otherwise.

According to embodiments of the present invention, when the fifth and sixth pixel transistors T5 and T6 are turned on, a current flowing in the first pixel transistor T1 may be transferred to the light-emitting element LED, and the light-emitting element LED may emit light.

The seventh pixel transistor T7 may be connected between the first electrode of the light-emitting element LED (in other words, the fourth node N4) and the initialization power line IPL. A gate electrode of the seventh pixel transistor T7 may be connected to an $i^{th}$-third scan line S3$i$ (hereinafter, referred to as a third scan line). The seventh pixel transistor T7 is turned on by a third scan signal supplied to the third scan line S3$i$ to supply a voltage of the initialization power supply Vint to the first electrode of the light-emitting element LED. In embodiments of the present invention, a timing of a third scan signal supplied to the third scan line S3$i$ is the same as a timing of one of scan signals supplied to the first scan line S1$i$, the (i-1)$^{th}$-first scan line S1$i$-1, and an (i+1)$^{th}$-first scan line (for example, denoted by S1$i$+1).

The storage capacitor Cst may be connected between the driving power line PL1 and the first node N1. In other words, the storage capacitor Cst may be connected to the gate electrode of the first pixel transistor T1.

In one embodiment of the present invention, the first scan signal may be supplied after the second scan signal is supplied. For example, the second scan signal and the first scan signal may be supplied with a difference of one horizontal period.

In one embodiment of the present invention, the third scan signal may be supplied simultaneously with the first scan signal. However, this is merely an example, and the first scan signal may be supplied after the third scan signal is supplied. For example, a supply interval between the third scan signal and the first scan signal may be one horizontal period. Alternatively, the third scan signal may be supplied after the first scan signal is supplied.

The sensor circuit SSC may include a first sensor transistor M1, a second sensor transistor M2, and a third sensor transistor M3.

The first sensor transistor M1 and the second sensor transistor M2 may be connected in series between a sensing power line PL2 and the k$^{th}$ readout line RXk (hereinafter, referred to as a readout line). A voltage of a sensing power supply VDD2 may be supplied to the sensing power line PL2. For example, the voltage of the sensing power supply VDD2 may be different from the voltage of the driving power supply VDD1. However, this is merely an example, and the voltages of the sensing power supply VDD2 and the driving power supply VDD1 may be the same.

A gate electrode of the first sensor transistor M1 may be connected to the fifth node N5 or the first electrode (first sensor electrode) of the light-receiving element LRD. The first sensor transistor M1 may generate a detection current flowing from the sensing power line PL2 to the readout line RXk based on a voltage of the fifth node N5 caused by a photocurrent generated by the light-receiving element LRD.

In one embodiment of the present invention, a gate electrode of the second sensor transistor M2 may be connected to an (i-1)$^{th}$ sensing scan line SSi-1 (hereinafter, referred to as a previous sensing scan line). When a sensing scan signal is supplied to the previous sensing scan line SSi-1, the second sensor transistor M2 may be turned on to electrically connect the first sensor transistor M1 and the readout line RXk. Then, a detection signal (e.g., a detection current) may be supplied to the sensor driver 220 through the readout line RXk.

The third sensor transistor M3 may be connected between the previous sensing scan line SSi-1 and the fifth node N5. A gate electrode of the third sensor transistor M3 may be connected to an $i^{th}$ sensing scan line SSi (hereinafter, referred to as a sensing scan line). The third sensor transistor M3 may be turned on by a sensing scan signal supplied to the $i^{th}$ sensing scan line SSi to supply a voltage supplied to the previous sensing scan line SSi-1 to the fifth node N5. The third sensor transistor M3 may be used to reset (or initialize) a voltage of the fifth node N5.

In one embodiment of the present invention, the third sensor transistor M3 may include a plurality of sub-transistors M3-1 and M3-2 connected in series.

In one embodiment of the present invention, a supply timing of a sensing scan signal supplied to the sensing scan line SSi may be different from supply timings of scan signals supplied to the first to third scan lines S1$i$, S2$i$, and S3$i$. However, this is merely an example, and the sensing scan signal supplied to the sensing scan line SSi may be supplied at the same timing as one of the scan signals supplied to the first to third scan lines S1$i$, S2$i$, and S3$i$.

The pixel transistors T1 to T7 and the sensor transistors M1 to M3 may be P-type transistors (for example, p-channel metal-oxide semiconductor (PMOS) transistors) but are not limited thereto. For example, at least one of the pixel transistors T1 to T7 and the sensor transistors M1 to M3 may be implemented as an N-type transistor (for example, an n-channel metal-oxide semiconductor (NMOS) transistor). When the pixel transistors T1 to T7 and the sensor transistors M1 to M3 are N-type transistors, positions of a source area (e.g., a source electrode) and a drain area (e.g., a drain electrode) may be reversed.

Figure 3:
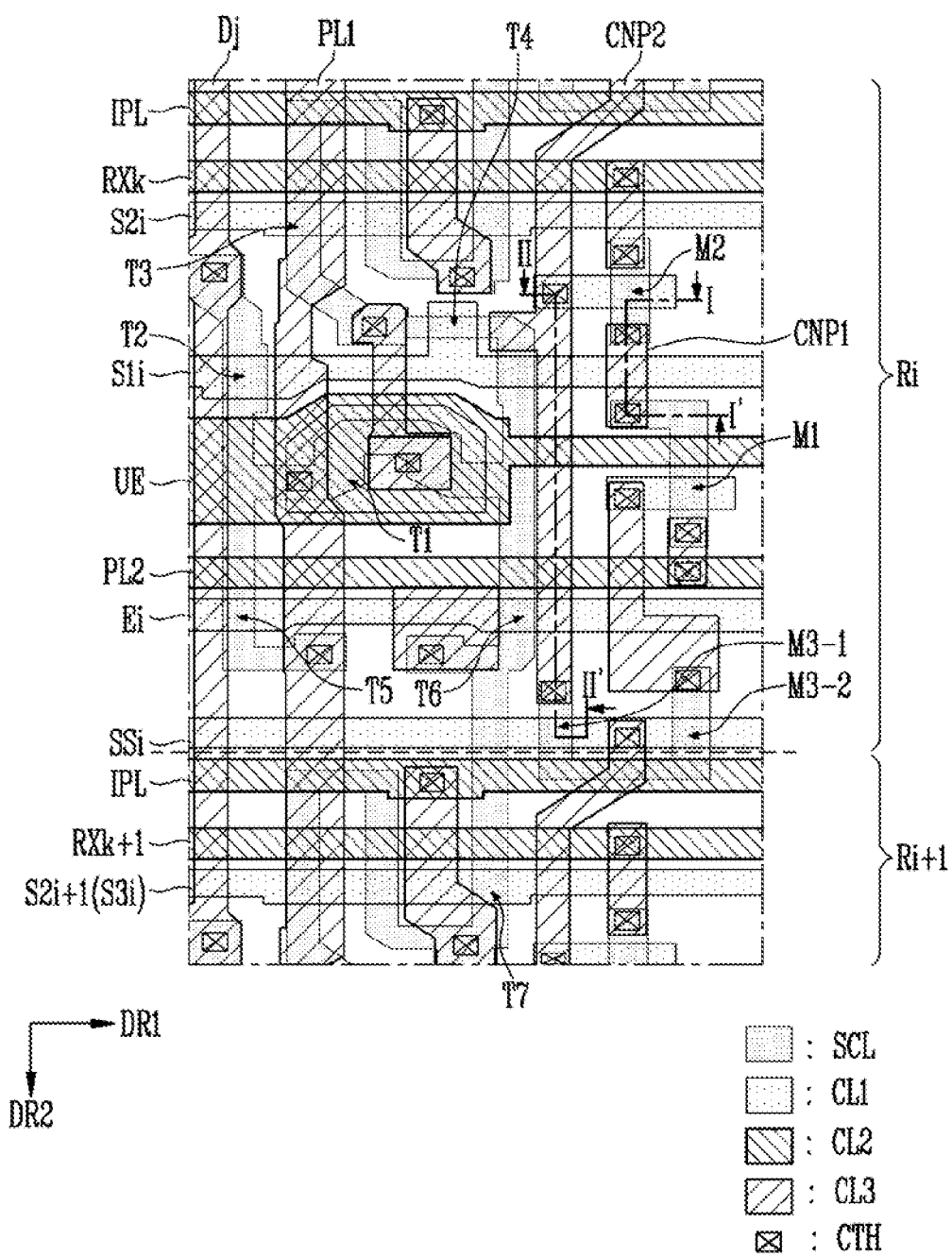
FIG. 3 is a layout view illustrating an example of a backplane structure including a pixel circuit and a sensor circuit of FIG. 2.
Figure 4A:
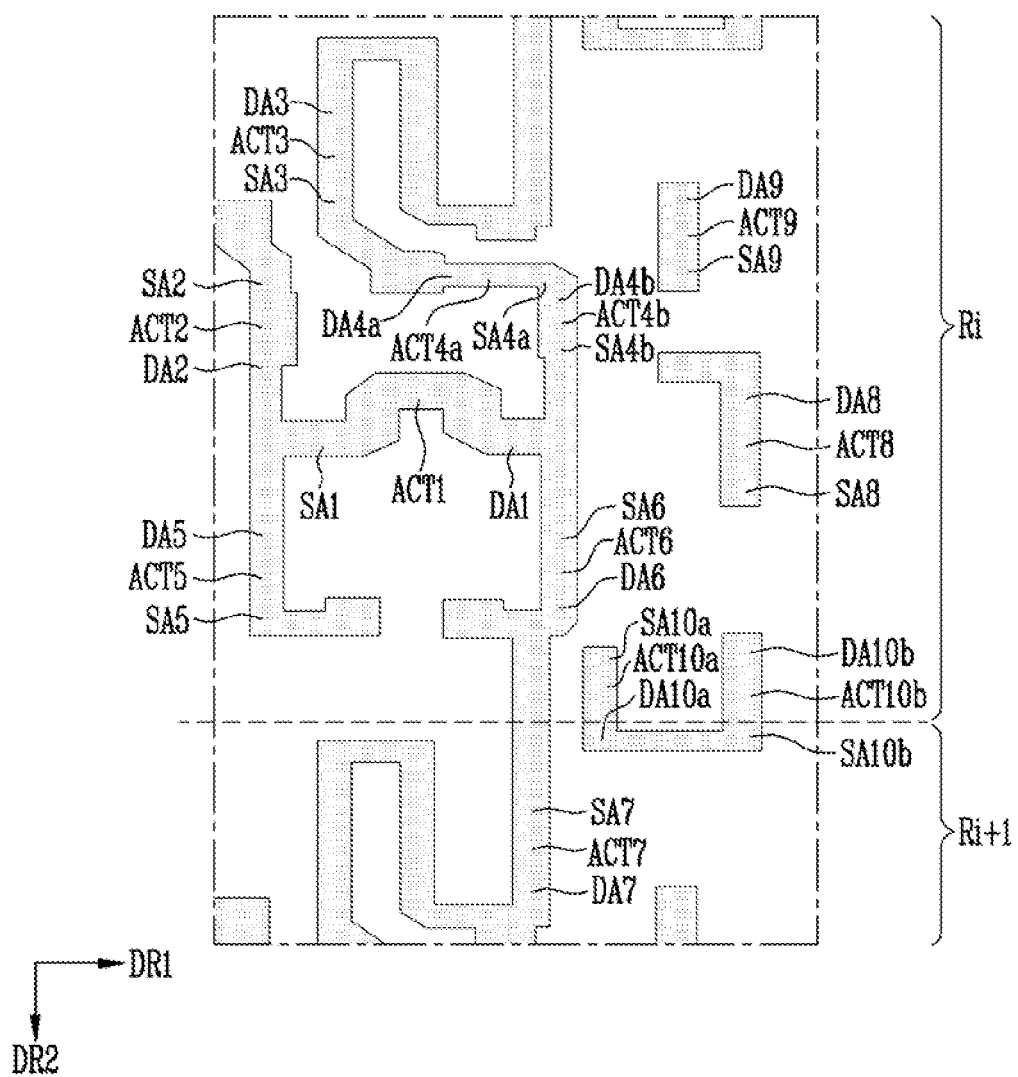
FIG. 4A is a plan view illustrating an example of a semiconductor layer included in the backplane structure of FIG. 3.
Figure 4B:
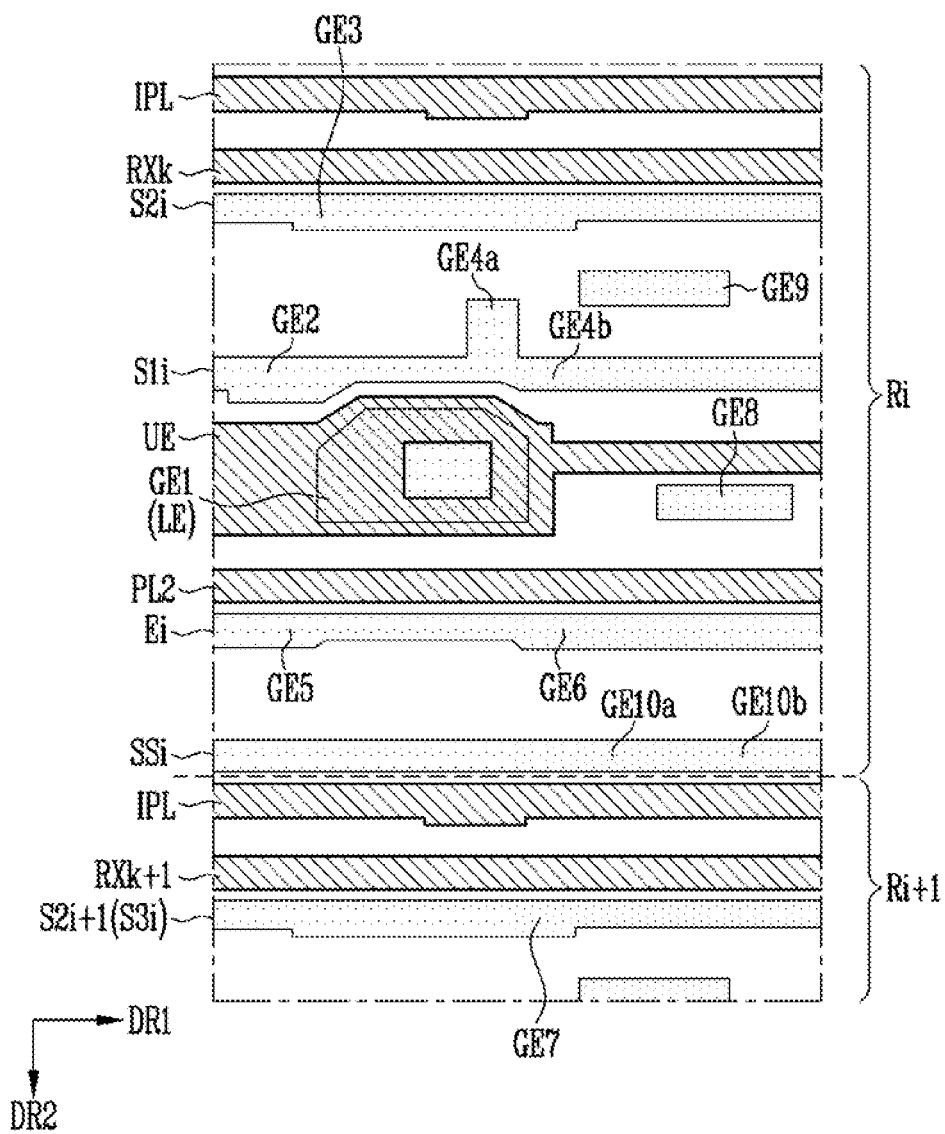
FIG. 4B is a plan view illustrating an example of a first conductive layer and a second conductive layer included in the backplane structure of FIG. 3.
Figure 4C:
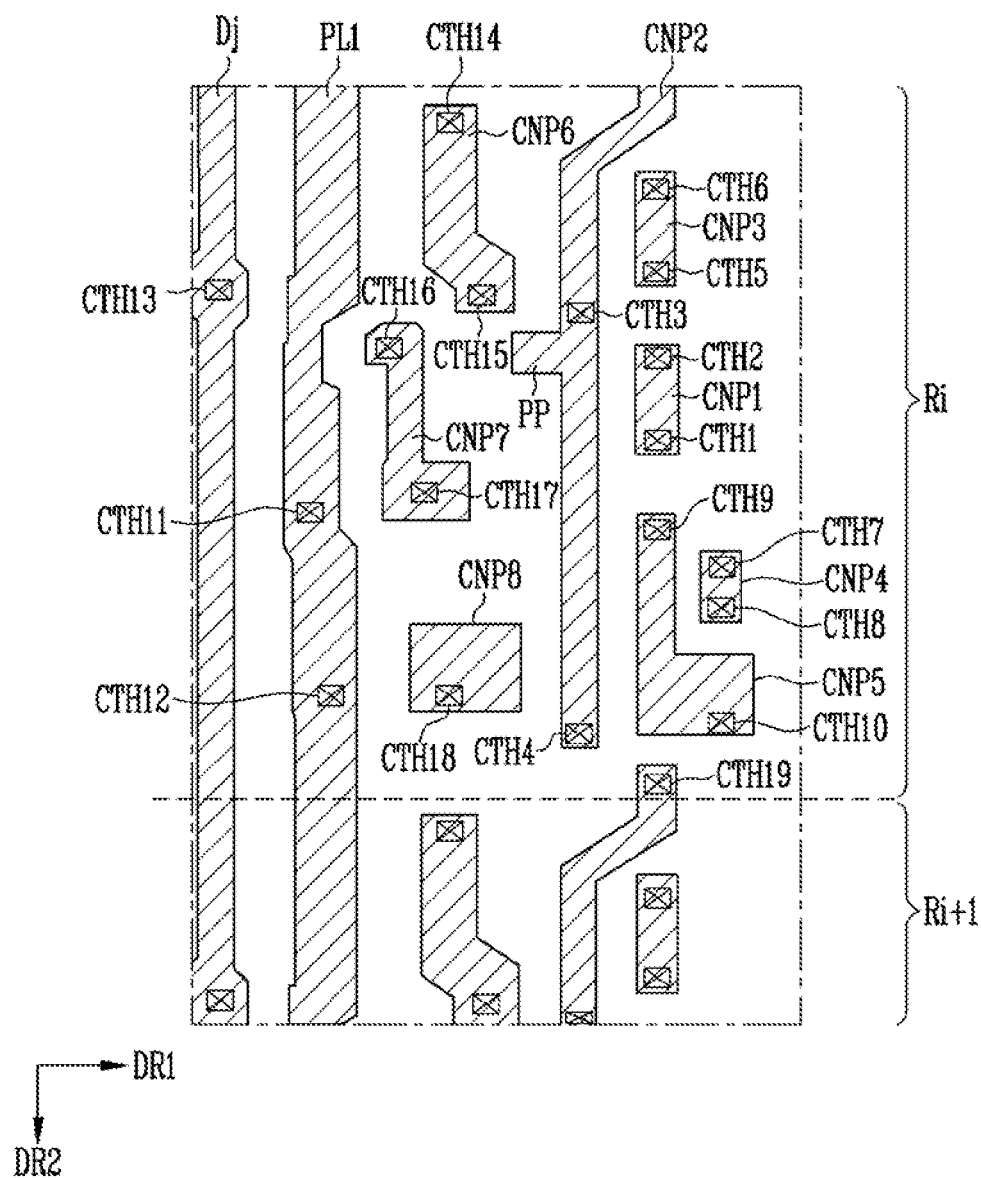
FIG. 4C is a plan view illustrating an example of a third conductive layer included in the backplane structure of FIG. 3.

FIG. 3 is a layout view illustrating an example of a backplane structure including the pixel circuit and the sensor circuit of FIG. 2. FIG. 4A is a plan view illustrating an example of a semiconductor layer included in the backplane structure of FIG. 3, FIG. 4B is a plan view illustrating an example of a first conductive layer and a second conductive layer included in the backplane structure of FIG. 3, and FIG. 4C is a plan view illustrating an example of a third conductive layer included in the backplane structure of FIG. 3.

Figure 5:
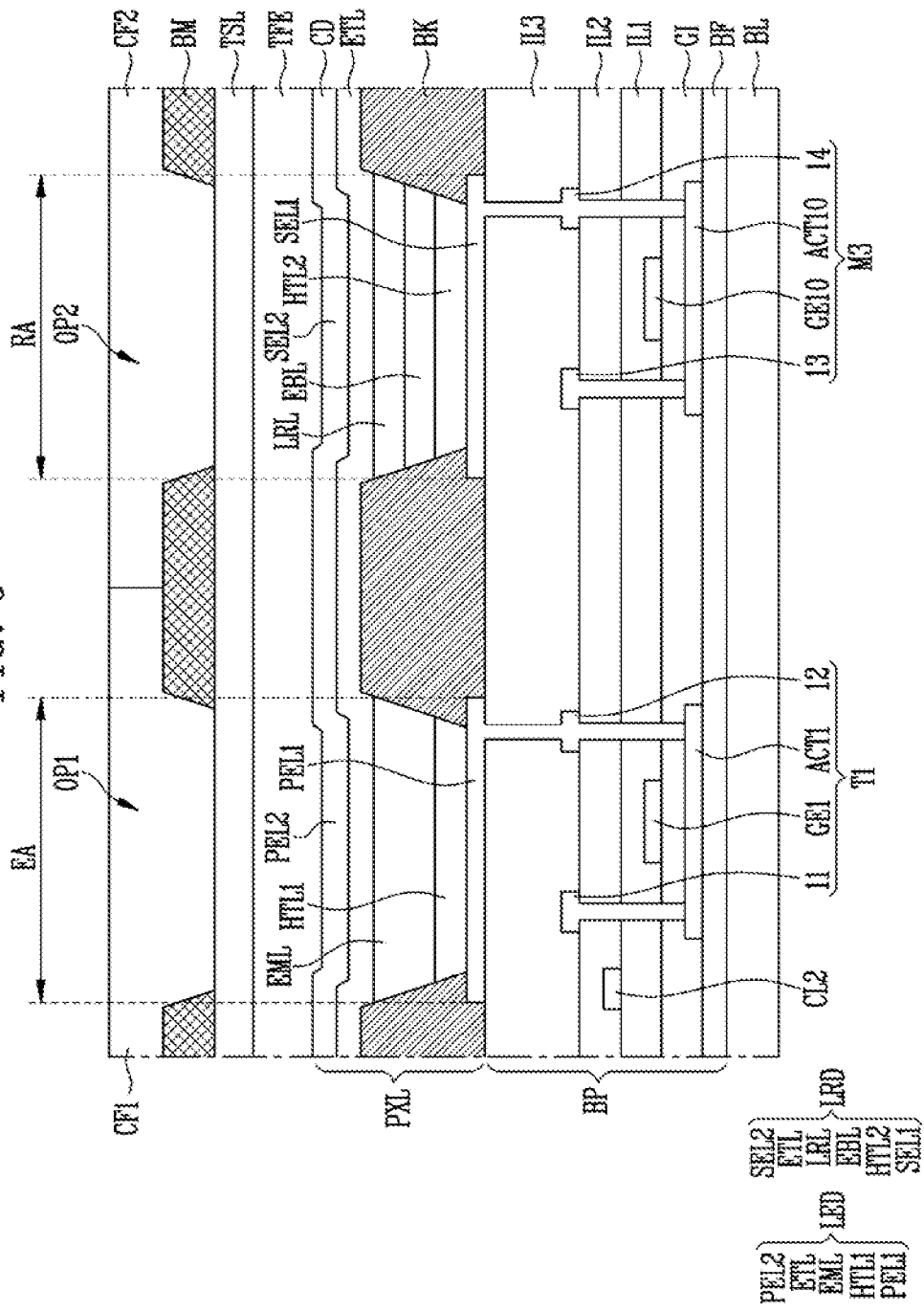
FIG. 5 is a cross-sectional view illustrating an example of a display area of FIG. 2.

In FIG. 3, a light-emitting element LED and a light-receiving element LRD are omitted for convenience of description, and FIG. 5 illustrates a stacked structure of the light-emitting element LED and the light-receiving element LRD.

Referring to FIGS. 2, 3, 4A, 4B, and 4C, the backplane structure includes a pixel circuit PXC and a sensor circuit SSC and may include various signal lines connected thereto.

The seventh pixel transistor T7 of the pixel circuit PXC described with reference to FIG. 2 may be disposed in an $(i+1)^{th}$ pixel row Ri+1. Accordingly, FIGS. 3, 4A, 4B, and 4C show an $i^{th}$ pixel row Ri and a portion of the $(i+1)^{th}$ pixel row Ri+1. In the $i^{th}$ pixel row Ri and the $(i+1)^{th}$ pixel row Ri+1, the same pattern of a semiconductor layer SCL and conductive layers CL1, CL2, and CL3 may be repeated. Accordingly, overlapping descriptions of repeated patterns and configurations having the same function will be omitted.

The semiconductor layer SCL, a first conductive layer CL1, a second conductive layer CL2, and a third conductive layer CL3 may be sequentially stacked on a base layer with predetermined insulating layers interposed therebetween. The pixel circuit PXC and the sensor circuit SSC of FIG. 2 may be formed by the semiconductor layer SCL, the first conductive layer CL1, the second conductive layer CL2, and the third conductive layer CL3. Accordingly, the pixel circuit PXC and the sensor circuit SSC may be formed together on the same backplane structure through the same process.

The semiconductor layer SCL may include a plurality of active patterns ACT1, ACT2, ACT3, ACT4a, ACT4b, ACT5, ACT6, ACT7, ACT8, ACT9, ACT10a, and ACT10b, a plurality of source areas SA1, SA2, SA3, SA4a, SA4b, SA5, SA6, SA7, SA8, SA9, SA10a, and SA10b, and a plurality of drain areas DA1, DA2, DA3, DA4a, DA4b, DA5, DA6, DA7, DA8, DA9, DA10a, and DA10b.

In one embodiment of the present invention, to prevent/minimize a leakage current, each of a fourth pixel transistor T4 and a third sensor transistor M3 may have a dual gate structure in which sub-transistors are connected in series. In this case, the fourth pixel transistor T4 may be formed by fourth active patterns ACT4a and ACT4b, fourth source areas SA4a and SA4b, fourth drain areas DA4a and DA4b, and fourth gate electrodes GE4a and GE4b, and the third sensor transistor M3 may be formed by tenth active patterns ACT10a and ACT10b, tenth source areas SA10a and SA10b, tenth drain areas DA10a and DA10b, and tenth gate electrodes GE10a and GE10b. However, this is merely an example, and at least some of the remaining transistors may also have a dual gate structure.

Predetermined parts of the semiconductor layer SCL overlapping the first conductive layer CL1 may be referred to as first, second, third, fourth, fifth, sixth, seventh, eighth, ninth and tenth active patterns ACT1, ACT2, ACT3, ACT4a, ACT4b, ACT5, ACT6, ACT7, ACT8, ACT9, ACT10a, and ACT10b. The first to seventh active patterns ACT1, ACT2, ACT3, ACT4a, ACT4b, ACT5, ACT6, and ACT7 may correspond to first to seventh pixel transistors T1 to T7. The eighth to tenth active patterns ACT8, ACT9, ACT10a, and ACT10b may correspond to first to third sensor transistors M1 to M3.

First, second, third, fourth, fifth, sixth and seventh source areas SA1, SA2, SA3, SA4a, SA4b, SA5, SA6, and SA7 may correspond to the first to seventh pixel transistors T1 to T7. Eighth, ninth and tenth source areas SA8, SA9, SA10a, and SA10b may correspond to the first to third sensor transistors M1 to M3. First, second, third, fourth, fifth, sixth and seventh drain areas DA1, DA2, DA3, DA4a, DA4b, DA5, DA6, and DA7 may correspond to the first to seventh pixel transistors T1 to T7. Eighth, ninth and tenth drain areas DA8, DA9, DA10a, and DA10b may correspond to the first to third sensor transistors M1 to M3.

In one embodiment of the present invention, the first to tenth active patterns ACT1, ACT2, ACT5, ACT4a, ACT4b, ACT5, ACT6, ACTT, ACT5, ACT5, ACT10a, and ACT10b may be formed of a semiconductor layer which is not doped with impurities, and the first to tenth source areas SA1, SA2, SA3, SA4a, SA4b, SA5, SA6, SA7, SA8, SA9, SA10a, and SA10b and the first to tenth drain areas DA1, DA2, DA3, DA4a, DA4b, DA5, DA6, DA7, DAB, DA9, DA10a, and DA10b may be formed of a semiconductor layer doped with impurities.

One end of the first active pattern ACT1 may be connected to the first source area SA1, and the other end of the first active pattern ACT1 may be connected to the first drain area DA1. A relationship between the remaining active patterns and the source and drain areas may be similar to a relationship between the first active pattern ACT1 and the first source and drain areas SA1 and DA1. For example, a first end of the second active pattern ACT2 may be connected to the second drain area DA2 and a second end of the second active pattern ACT2 may be connected to the second source area SA1.

The first active pattern ACT1 may have a shape extending in a first direction DR1 and may have a shape bent a plurality of times in an extended length direction thereof. The first active pattern ACT1 may overlap a first gate electrode GE1 in a plan view. Since the first active pattern ACT1 is formed to be elongated, a channel area of the first pixel transistor T1 may be elongated. Accordingly, a driving range of a gate voltage applied to the first pixel transistor T1 may be widened. In one embodiment of the present invention, the first direction DR1 may be a horizontal direction or a direction substantially parallel to the $i^{th}$ pixel row Ri.

In one embodiment of the present invention, each of the eighth to tenth active patterns ACT8, ACT9, ACT10a, and ACT10b may be formed in an island shape that is not connected to other patterns of the semiconductor layer SCL. In other words, each of the eighth to tenth active patterns ACT8, ACT5, ACT10a, and ACT10b may not be connected to other active patterns.

The first conductive layer CL1 may be formed on a gate insulating layer covering at least a portion of the semiconductor layer SCL. As shown in FIGS. 3 and 4B, the first conductive layer CL1 may include first, second, third, fourth, fifth, sixth, seventh, eighth, ninth and tenth gate electrodes GE1, GE2, GE3, GE4a, GE4b, GE5, GE6, GE7, GE8, GE9, GE10a, and GE10b, a lower electrode LE of a storage capacitor Cst, a first scan line S1i, a second scan line S2i, a third scan line S3i, an emission control line Ei, and a sensing scan line SSi. In one embodiment of the present invention, the first to tenth gate electrodes GE1, GE2, GE3, GE4a, GE4b, GE5, GE6, GE7, GE8, GE9, GE10a, and GE10b, the lower electrode LE, the first scan line S1i, the second scan line S2i, the third scan line S3i, the emission control line Ei, and the sensing scan line SSi may be formed to be coplanar with each other using the same material and process.

The first scan line S1i, the second scan line S2i, the third scan line S3i, the emission control line Ei, and the sensing scan line SSi may extend in the first direction DR1.

In one embodiment of the present invention, the second and fourth gate electrodes GE2, GE4a, and GE4b may be part of the first scan line S1i. The third gate electrode GE3 may be part of the second scan line S2i. The fifth and sixth gate electrodes GE5 and GE6 may be part of the emission control line Ei. The tenth gate electrodes GE10a and GE10b may be part of the sensing scan line SSi.

In one embodiment of the present invention, the seventh gate electrode GE7 may be part of the third scan line S3i extending in the first direction DR1 in the $(i+1)^{th}$ pixel row Ri+1. For example, the third scan line S3i may be the same as an $(i+1)^{th}$-second scan line S2i+1.

Each of the eighth and ninth gate electrodes GE8 and GE9 may be conductive patterns having an island shape. Accordingly, an influence due to an unintended antenna effect may be reduced.

The second conductive layer CL2 may be formed on a first insulating layer covering at least a portion of the first conductive layer CL1. Referring to FIGS. 3 and 4B, the second conductive layer CL2 may include an initialization power line IPL, a readout line RXk, an upper electrode UE of the storage capacitor Cst, and a sensing power line PL2. In one embodiment of the present invention, the initialization power line IPL, the readout line RXk, the upper electrode UE, and the sensing power line PL2 may be formed to be coplanar with each other using the same material and process.

The initialization power line IPL extends in the first direction DR1 and may transmit a voltage of an initialization power supply Vint.

The upper electrode UE may overlap the lower electrode LE. Accordingly, the storage capacitor Cst may be formed by the lower electrode LE and the upper electrode UE with the first insulating layer interposed therebetween. In one embodiment of the present invention, an area of the upper electrode UE may be greater than an area of the lower electrode LE. In one embodiment of the present invention, the upper electrode UE may include an opening in a portion of a seventh connection pattern CNP7 overlapping the upper electrode UE.

The readout line RXk may extend in the first direction DR1 and may provide a path through which a detection current generated by the sensor circuit SSC flows. The detection current may be provided to a driving circuit 200 or a sensor driver 220 through the readout line RXk. In one embodiment of the present invention, k of the readout line RXk and i of the sensing scan line SSi may be the same.

The sensing power line PL2 may extend in the first direction DR1 and may supply a voltage of a sensing power supply VDD2 to the sensor circuit SSC (for example, the first sensor transistor M1). For example, the sensing power supply VDD2 may be a direct current (DC) power supply. In other words, the sensing power line PL2 and the driving power line PL1 may be separately formed and may extend in different directions.

In one embodiment of the present invention, a $(k+1)^{th}$ readout line RXk+1 extending in the first direction DR1 may be provided in the $(i+1)^{th}$ pixel row Ri+1. For example, the $(k+1)^{th}$ readout line RXk+1 may be electrically connected to the readout line RXk in another area not shown in FIG. 3. Alternatively, the $(k+1)^{th}$ readout line RXk+1 may be formed as a line separately from the readout line RXk.

The third conductive layer CL3 may be formed on a second insulating layer covering at least a portion of the second conductive layer CL2. As shown in FIGS. 3 and 4C, the third conductive layer CL3 may include a data line Dj, a driving power line PL1, a first connection pattern CNP1, and a second connection pattern CNP2. The third conductive layer CL3 may further include third, fourth, fifth, sixth, seventh and eighth connection patterns CNP3, CNP4, CNP5, CNP6, CNP7 and CNP8. In one embodiment of the present invention, the data line Dj, the driving power line PL1, and the first to eighth connection patterns CNP1 to CNP8 may be formed to be coplanar with each other using the same material and process.

The first to eighth connection patterns CNP1 to CNP8 may each be formed in an island shape and may electrically interconnect predetermined components thereunder through contact holes.

The first to fifth connection patterns CNP1 to CNP5 may be used to form the sensor circuit SSC.

The first connection pattern CNP1 may connect the first sensor transistor M1 and the second sensor transistor M2. In one embodiment of the present invention, the first connection pattern CNP1 may be connected to the eighth drain area DA8 through a first contact hole CTH1 and connected to the ninth source area SA9 through a second contact hole CTH2. Accordingly, the first connection pattern CNP1 may electrically connect the first sensor transistor M1 and the second sensor transistor M2.

The first connection pattern CNP1 may extend in a second direction DR2. The second direction DR2 intersects the first direction DR1 and may be a direction substantially parallel to a vertical direction or a pixel column.

The second connection pattern CNP2 may be connected to a previous sensing scan line SSi−1 and the third sensor transistor M3. In addition, in one embodiment of the present disclosure, the second connection pattern CNP2 may be further connected to a gate electrode of the second sensor transistor M2 (in other words, a ninth gate electrode GE9).

The second connection pattern CNP2 may extend from a portion overlapping a sensing scan line of a previous pixel row to the $i^{th}$ pixel row Ri in the second direction DR2. For example, a nineteenth contact hole CTH19 shown in FIG. 4C is formed in the second connection pattern of the $(i+1)^{th}$ pixel row Ri+1 and may be connected to the sensing scan line SSi. Similarly, the second connection pattern CNP2 of the $i^{th}$ pixel row Ri may be connected to an $(i-1)^{th}$ sensing scan line (in other words, the previous sensing scan line SSi−1) through a contact hole.

The second connection pattern CNP2 may be connected to the ninth gate electrode GE9 through a third contact hole CTH3 and may be connected to a $10a^{th}$ source area SA10a through a fourth contact hole CTH4. Accordingly, a sensing scan signal supplied to the previous sensing scan line SSi−1 may be provided to a source electrode of the third sensor transistor M3 and the gate electrode of the second sensor transistor M2.

In one embodiment of the present invention, the second connection pattern CNP2 may include a protrusion PP protruding in a direction opposite to the first direction DR1. For example, the protrusion PP may protrude towards a sixteenth contact hole CTH16. The protrusion PP may overlap an area between a $4a^{th}$ active pattern ACT4a and a $4b^{th}$ active pattern ACT4b of the semiconductor layer SCL of the fourth pixel transistor T4 having a dual gate structure. Accordingly, an effect of preventing current leakage can be further improved.

In one embodiment of the present invention, the third connection pattern CNP3 extending in the second direction DR2 may electrically connect the readout line RXk and the second sensor transistor M2. For example, the third connection pattern CNP3 may be connected to the ninth drain area DA9 through a fifth contact hole CTH5 and connected to the readout line RXk through a sixth contact hole CTH6. The fifth and sixth contact hole CTH5 and CTH6 may be provided at opposite sides of the third connection pattern CNP3.

In an embodiment of the present invention, a fourth connection pattern CNP4 may electrically connect the first sensor transistor M1 and the sensing power line PL2. For example, the fourth connection pattern CNP4 may be connected to the eighth source area SA8 through a seventh contact hole CTH7 and connected to the sensing power line PL2 through an eighth contact hole CTH8. The fourth connection pattern CNP4 may extend in the second direction DR2 and be smaller than the third connection pattern CNP3.

In an embodiment of the present invention, a fifth connection pattern CNP5 may electrically connect the third sensor transistor M3 and a gate electrode of the first sensor transistor M1. The fifth connection pattern CNP5 may correspond to a fifth node N5. For example, the fifth connection pattern CNP5 may be connected to the eighth gate electrode GE8 through a ninth contact hole CTH9 and to a $10b^{th}$ drain area DA10b through a tenth contact hole CTH10. The fifth connection pattern CNP5 may have an L shape.

In addition, the fifth connection pattern CNP5 may be connected to a first sensor electrode of the light-receiving element LRD through a contact hole formed thereon.

As described above, the sensor circuit SSC may be simultaneously formed by the semiconductor layer SCL and the first to third conductive layers CL1 to CL3 which form the pixel circuit PXC.

The driving power line PL1 extends in the second direction DR2 and may transmit a voltage of a driving power supply VDD1. The driving power line PL1 may be connected to the upper electrode UE through an eleventh contact hole CTH11 and connected to the fifth source area SA5 through a twelfth contact hole CTH12. The eleventh and twelfth contact holes CTH11 and CTH12 may both be provided in the $i^{th}$ pixel row Ri. Accordingly, the voltage of the driving power supply VDD1 may be supplied to one electrode (the upper electrode UE) of the storage capacitor Cst and the fifth pixel transistor T5.

The data line Dj may extend in the second direction DR2 and may transmit a data signal. The data line Dj may be connected to the second source area SA2 through a thirteenth contact hole CTH13. Accordingly, the data signal may be provided to the second pixel transistor T2.

In one embodiment of the present invention, a sixth connection pattern CNP6 may electrically connect the initialization power line IPL and the third pixel transistor T3. For example, the sixth connection pattern CNP6 may be connected to the initialization power line IPL through a fourteenth contact hole CTH14 and may be connected to the third drain area DA3 through a fifteenth contact hole CTH15.

In one embodiment of the present invention, a seventh connection pattern CNP7 may connect the third pixel transistor T3 and a gate electrode of the first pixel transistor T1. The seventh connection pattern CNP7 may have an island shape. For example, the seventh connection pattern CNP7 may be connected to the third source area SA3 through a sixteenth contact hole CTH16 and connected to the first gate electrode GE1 through a seventeenth contact hole CTH17. The seventeenth contact hole CTH17 may pass through the opening of the upper electrode UE.

In one embodiment of the present invention, an eighth connection pattern CNP8 may be connected to the sixth pixel transistor T6 and the seventh pixel transistor T7. The eighth connection pattern CNP8 may have an island shape. The eighth connection pattern CNP8 may be connected to the sixth drain area DA6 and the seventh source area SA7 through an eighteenth contact hole CTH18. In addition, the eighth connection pattern CNP8 may be connected to a first pixel electrode of the light-emitting element LED through a contact hole formed thereon.

As described above, a display device 1000 according to embodiments of the present invention may include the sensing power line PL2, the sensing scan line SSi, and the read out line RXk which each extend in the first direction DR1 on the first insulating layer and the first to third connection patterns CNP1, CNP2, and CNP3 which each extend in the second direction DR2 on the second insulating layer. Accordingly, in a manufacturing process of the pixel circuit PXC, the sensor circuit SSC occupying a relatively small space may be formed simultaneously with the pixel circuit PXC without an additional mask and an additional process. Accordingly, it is possible to reduce a thickness of the display device 1000 including an optical sensor PHS while reducing manufacturing costs.

FIG. 5 is a cross-sectional view illustrating an example of a display area of FIG. 2.

Referring to FIGS. 1 to 5, a display panel 100 of a display device 1000 may include a base layer BL, a backplane structure BP, a pixel layer PXL, and an encapsulation layer TFE. The display panel 100 may further include a touch sensor layer TSL, a black matrix BM, and color filters CF1 and CF2. The black matrix BM may form an optical system for transmitting light to a light-receiving element LRD.

The cross-sectional view of FIG. 5 shows some components of a pixel PX and an optical sensor PHS. In FIG. 5, components of a first pixel transistor T1 and a third sensor transistor M3 will be mainly described. The first pixel transistor T1 may include a first active pattern ACT1, a first gate electrode GE1, a first source electrode 11, and a first drain electrode 12. The third sensor transistor M3 may include a tenth active pattern ACT10, a tenth gate electrode GE10, a tenth source electrode 13, and a tenth drain electrode 14.

The base layer BL may be made of an insulating material such as glass or a resin. In addition, the base layer BL may be made of a material having flexibility to be bendable or foldable and may have a single-layered structure or a multi-layered structure.

The backplane structure BP including a pixel circuit PXC and a sensor circuit SSC may be provided on the base layer BL. The backplane structure BP may include a semiconductor layer SCL, conductive layers CL1, CL2, and CL3, and insulating layers GI, IL1, IL2, and IL3.

A buffer layer BF may be formed on the base layer BL. The buffer layer BF may prevent impurities from diffusing into the transistors T1 and M3. The buffer layer BF may be omitted according to a material and a process condition of the base layer BL.

The semiconductor layer SCL including the first active pattern ACT1 and the tenth active pattern ACT10 is provided on the buffer layer BF. In one embodiment of the present invention, the semiconductor layer SCL may include a polysilicon semiconductor. For example, the semiconductor layer SCL may be formed through a low-temperature poly-silicon (LTPS) process. However, this is merely an example, and at least a portion of the semiconductor layer SCL may be made of an oxide semiconductor, a metal oxide semiconductor, or the like.

A gate insulating layer GI may be provided on the semiconductor layer SCL. The gate insulating layer GI may be an inorganic insulating layer made of an inorganic material.

A first conductive layer CL1 including the first gate electrode GE1 and the tenth gate electrode GE10 may be provided on the gate insulating layer GI. The first gate electrode GE1 may cover an area corresponding to a channel area of the first active pattern ACT1. The tenth gate electrode GE10 may cover an area corresponding to a channel area of the tenth active pattern ACT10.

The first conductive layer CL1 including the first gate electrode GE1 and the tenth gate electrode GE10 may be made of a metal. For example, the first conductive layer CL1 may be made of at least one selected from metals such as gold (Au), silver (Ag), aluminum (Al), molybdenum (Mo), chromium (Cr), titanium (Ti), nickel (Ni), neodymium (Nd), and copper (Cu), or an alloy of the metals. In addition, the first conductive layer CL1 may be formed as a single layer or a multi-layer in which two or more materials selected from metals and alloys are stacked.

A first insulating layer IL1 (or a first interlayer insulating layer) may be provided on the first conductive layer CL1. The first insulating layer IL1 may be an inorganic insulating layer made of an inorganic material. As the inorganic material, polysiloxane, silicon nitride, silicon oxide, silicon oxynitride, or the like may be used.

A second conductive layer CL2 may be provided on the first insulating layer IL1, In FIG. 5, the second conductive layer CL2 may be spaced apart from the first conductive layer CL1 in vertical and horizontal directions. In one embodiment of the present invention, the second conductive layer CL2 may include an upper electrode UE, a readout line RXk, an initialization power line IPL, and a sensing power line PL2. The second conductive layer CL2 may be made of at least one selected from metals such as gold (Au), silver (Ag), aluminum (Al), molybdenum (Mo), chromium (Cr), titanium (Ti), nickel (Ni), neodymium (Nd), and copper (Cu), or an alloy of the metals. In addition, the second conductive layer CL2 may be formed as a single layer, but the present invention is not limited thereto. The second conductive layer CL2 may be formed as a multi-layer in which two or more materials selected from metals and alloys are stacked.

A second insulating layer IL2 (or a second interlayer insulating layer) may be provided on the second conductive layer CL2. The second insulating layer IL2 may be an inorganic insulating layer made of an inorganic material. As the inorganic material, polysiloxane, silicon nitride, silicon oxide, silicon oxynitride, or the like may be used.

A third conductive layer CL3 including the first source electrode 11, the first drain electrode 12, the tenth source electrode 13, and the tenth drain electrode 14 may be provided on the second insulating layer IL2. As shown in FIG. 5, the first to third conductive layers CL1 to CL3 are arranged in sequence. Although the first pixel transistor T1 and the third sensor transistor M3 are illustrated in FIG. 5 on the assumption that the first pixel transistor T1 and the third sensor transistor M3 are P-type transistors, a source electrode and a drain electrode may vary according to a type of transistor.

The first source electrode 11 and the first drain electrode 12 may be in contact with a source area and a drain area at both sides of the first active pattern ACT1 through contact holes formed in the gate insulating layer GI, the first insulating layer IL1, and the second insulating layer IL2, respectively.

The tenth source electrode 13 and the tenth drain electrode 14 may be in contact with a source area and a drain area at both sides of the tenth active pattern ACT2 through contact holes formed in the first insulating layer IL1, the second insulating layer IL2, and the gate insulating layer GI, respectively.

The third conductive layer CL3 including the source electrodes 11 and 13 and the drain electrodes 12 and 14 may be made of a metal. For example, the third conductive layer CL3 may be made of at least one selected from metals such as gold (Au), silver (Ag), aluminum (Al), molybdenum (Mo), chromium (Cr), titanium (Ti), nickel (Ni), neodymium (Nd), and copper (Cu), or an alloy of the metals.

In one embodiment of the present invention, a passivation layer may be provided on the third conductive layer CL3. The passivation layer may be an inorganic insulating layer made of an inorganic material. As the inorganic material, polysiloxane, silicon nitride, silicon oxide, silicon oxynitride, or the like may be used.

A third insulating layer IL3 may be provided on the third conductive layer CL3 (or the passivation layer). In one embodiment of the present invention, the third insulating layer IL3 may be an organic insulating layer made of an organic material. As the organic material, an organic insulating material such as a polyacryl-based compound, a polyimide-based compound, a fluorine-based carbon compound such as Teflon, or a benzocyclobutene compound may be used. Alternatively, the third insulating layer IL3 may be an inorganic insulating layer made of an inorganic material.

Although the third insulating layer IL3 is illustrated in FIG. 5 as being provided on the second insulating layer IL2, the arrangement of insulating layers may vary. For example, only the passivation layer may be provided on the source and drain electrodes 11, 12, 13, and 14, and a first pixel electrode PEL1 and a first sensor electrode SEL1 may be provided on the passivation layer. Alternatively, an additional conductive layer and a fourth insulating layer covering the additional conductive layer may be provided on the third insulating layer IL3, and the first pixel electrode PEL1 and the first sensor electrode SEL1 may be provided on the fourth insulating layer.

The pixel layer PXL may be provided on the backplane structure BP. For example, the pixel layer PXL may be disposed on a surface of the third insulating layer IL3. The pixel layer PXL may include a light-emitting element LED connected to the pixel circuit PXC and the light-receiving element LRD connected to the sensor circuit SSC.

In one embodiment of the present invention, the light-emitting element LED may include a first pixel electrode PEL1, a first hole transport layer HTL1, a light-emitting layer EML, an electron transport layer ETL, and a second pixel electrode PEL2. The first hole transport layer HTL1, the light-emitting layer EML and the electron transport layer ETL may be disposed between the first and second pixel electrodes PEL1 and PEL2. In one embodiment of the present invention, the light-receiving element LRD may include a first sensor electrode SEL1, a second hole transport layer HTL2, an electron blocking layer EBL, a light-receiving layer LRL, the electron transport layer ETL, and a second sensor electrode SEL2. The second hole transport layer HTL2, the electron blocking layer EBL, the light-receiving layer LRL and the electron transport layer ETL may be disposed between the first and second sensor electrodes SEL1 and SEL2.

In one embodiment of the present invention, the first pixel electrode PEL1 and the first sensor electrode SEL1 may include a metal layer of Ag, Mg, Al, Pt, Pd, Au, Ni, Nd, Ir, Cr, or an alloy thereof and/or may be made of indium tin oxide (ITO), indium zinc oxide (IZO), zinc oxide (ZnO), indium tin zinc oxide (ITZO), or the like. The first pixel electrode PEL1 may be connected to the first drain electrode 12 through a contact hole. The first sensor electrode SEL1 may be connected to the tenth drain electrode 14 through a contact hole.

The first pixel electrode PEL1 and the first sensor electrode SEL1 may be simultaneously formed through patterning using a mask.

A bank layer BK (or a pixel definition film) which partitions a light-emitting area EA and a light-receiving area RA may be provided on the third insulating layer IL3 on which the first pixel electrode PEL1 and the first sensor electrode SEL1 are formed. The bank layer BK may be an organic insulating layer made of an organic material. The organic material may include an acrylic resin, an epoxy resin, a phenolic resin, a polyamide resin, a polyimide resin, and the like.

In addition, the bank layer BK may include a light absorbing material or absorb light introduced from the outside by applying a light absorbent. For example, the bank layer BK may include a carbon-based black pigment. However, the present invention is not limited thereto, and the bank layer BK may include an opaque metal material such as chromium (Cr), molybdenum (Mo), an alloy (MoTi) of molybdenum and titanium, tungsten (W), vanadium (V), niobium (Nb), tantalum (Ta), manganese (Mn), cobalt (Co), or nickel (Ni) which has a high light absorption rate.

The bank layer BK may expose an upper surface of the first pixel electrode PEL1 and an upper surface of the first sensor electrode SEL1 and may protrude from the third insulating layer IL3 along a circumference of the light-emitting area EA and a circumference of the light-receiving area RA. In other words, the bank layer BK may include openings corresponding to the light-emitting area EA and the light-receiving area RA.

The first hole transport layer HTL1 may be provided on the upper surface of the first pixel electrode PEL1 exposed by the bank layer BK, and the second hole transport layer HTL2 may be provided on the exposed upper surface of the first sensor electrode SEL1. Holes may move to the light-emitting layer EML through the first hole transport layer HTL1, and holes may move to the light-receiving layer LRL through the second hole transport layer HTL2.

In one embodiment of the present invention, the first hole transport layer HTL1 and the second hole transport layer HTL2 may be the same or different according to materials of the light-emitting layer EML and the light-receiving layer LRL.

The light-emitting layer EML may be provided on the first hole transport layer HTL1 in the light-emitting area EA surrounded by the bank layer BK. In one embodiment of the present invention, the light-emitting layer EML may be formed as an organic light-emitting layer. The light-emitting layer EML may emit light such as red light, green light, or blue light according to an organic material included in the light-emitting layer EML.

In one embodiment of the present invention, as shown in FIG. 5, the electron blocking layer EBL may be provided on the second hole transport layer HTL2 in the light-receiving area RA surrounded by the bank layer BK. The electron blocking layer EBL may block electric charges of the light-receiving layer LRL from moving to the second hole transport layer HTL2. The electron blocking layer EBL may be in direct contact with both of the light-receiving layer LRL and the second hole transport layer HTL2. In one embodiment of the present invention, the electron blocking layer EBL may include the same material as the first hole transport layer HTL1 of the light-emitting area.

In one embodiment of the present invention, the electron blocking layer EBL may be omitted.

The light-receiving layer LRL may be disposed on the electron blocking layer EBL or the second hole transport layer HTL2. The light-receiving layer LRL may detect an intensity of light by emitting electrons in response to light having a specific wavelength band.

In one embodiment of the present invention, the light-receiving layer LRL may include a low molecular weight organic material. For example, the light-receiving layer LRL is made of a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

Alternatively, the low molecular weight organic material included in the light-receiving layer LRL may be formed as a bi-layer which includes a layer including a phthalocyanine compound that includes at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn) and a layer including C60 or may be formed as an one mixing layer in which a phthalocyanine compound and C60 are mixed.

However, this is merely an example, and the light-receiving layer LRL may include a polymer organic layer.

An area of the light-receiving area RA may be less than an area of the light-emitting area EA. Accordingly, the existence of the light-receiving area RA does not significantly affect the light emission of the pixel PX for displaying an image, and image quality greater that or equal to a certain level may be secured.

In an embodiment of the present invention, the electron transport layer ETL may be provided on the light-emitting layer EML and the light-receiving layer LRL. The electron transport layer ETL may be integrally formed on a display area AA. Accordingly, the electron transport layer ETL may contact an upper surface of the bank layer BK. The electron transport layer ETL may also contact side surfaces of the bank layer BK.

However, this is merely an example, and at least one component of the first hole transport layer HTL1, the second hole transport layer HTL2, the electron blocking layer EBL, and the electron transport layer ETL may be omitted. In addition, functional layers such as a hole injection layer and an electron injection layer may be added.

The second pixel electrode PEL2 may be provided on the electron transport layer ETL of the light-emitting area EA, and the second sensor electrode SEL2 may be provided on the electron transport layer ETL of the light-receiving area RA. In one embodiment of the present invention, the second pixel electrode PEL2 and the second sensor electrode SEL2 may be a common electrode CD integrally formed on the display area AA. A voltage of a second power supply VSS may be supplied to the second pixel electrode PEL2 and the second sensor electrode SEL2. In other words, the common electrode CD may be supplied with the same power.

The second pixel electrode PEL2 and the second sensor electrode SEL2 may be formed as a metal layer of Ag, Mg, Al, Pt, Pd, Au, Ni, Nd, Ir, or Cr and/or a transparent conductive layer of ITO, IZO, ZnO, ITZO, or the like. In one embodiment of the present invention, the common electrode CD may be formed as two or more layers including a thin metal layer, for example, a triple layer of ITO/Ag/ITO.

The encapsulation layer TFE may be provided on the common electrode CD including the second pixel electrode PEL2 and the second sensor electrode SEL2. For example, the encapsulation layer TFE may directly contact the common electrode CD. The encapsulation layer TFE may be formed as a single layer but may be formed as a multi-layer. In one embodiment of the present invention, the encapsulation layer TFE may have a stacked structure in which an inorganic material, an organic material, and an inorganic material are sequentially deposited. An uppermost layer of the encapsulation layer TFE may be formed of an inorganic material.

In one embodiment of the present invention, the touch sensor layer TSL may be disposed on the encapsulation layer TFE. The touch sensor layer TSL may include a conductive pattern for touch sensing and an insulating layer. The conductive pattern of the touch sensor layer TSL may be formed as a single layer or two layers formed with an insulating layer interposed therebetween.

In one embodiment of the present invention, to secure image quality and a reception amount, the conductive pattern of the touch sensor layer TSL may be disposed to avoid the light-emitting area EA and the light-receiving area RA.

The black matrix BM may be provided on the encapsulation layer TFE or the touch sensor layer TSL. The black matrix BM may absorb or block light introduced from the outside. The black matrix BM may include an organic light blocking material. For example, the organic light blocking material may include at least one selected from carbon black (CB) and titanium black (TiBK), but the present invention is not necessarily limited thereto.

The black matrix BM may include a plurality of openings OP1 and OP2. In one embodiment of the present invention, the black matrix BM may be formed through a patterning process using a mask or a printing process.

In one embodiment of the present invention, the black matrix BM may be provided to overlap the bank layer BK. In addition, the black matrix BM may be disposed to cover the conductive pattern of the touch sensor layer TSL. In addition, the black matrix BM may cover the bank layer BK. The black matrix BM is disposed to avoid the light-emitting area EA. For example, the black matrix BM may be provided in the form of a pattern including a first opening OP1 overlapping the light-emitting area EA. The first opening OP1 may also overlap the first pixel transistor T1.

A second opening OP2 of the black matrix BM may overlap the light-receiving area RA. The second opening OP2 may also overlap the third sensor transistor M3. The second opening OP2 of the black matrix BM may provide an optical path through which external light is incident to the light-receiving layer LRL.

For example, a vertical light component of external light may be transmitted to the light-receiving layer LRL through the second opening OP2. Alternatively, a phase of an image formed on the light-receiving layer LRL through the second opening OP2 may be inverted by 180° from external light. However, this is merely an example, and a function of the second opening OP2 as an optical system may be determined by a width of the second opening OP2, a thickness of the black matrix BM, a distance between the black matrix BM and the light-receiving layer LRL, and a distance between the black matrix BM and an upper structure (such as a window).

In one embodiment of the present invention, color filters CF1 and CF2 may be disposed on the touch sensor layer TSL and the black matrix BM. A first color filter CF1 may be one of a red color filter, a green color filter, and a blue color filter according to a color of light emitted from the light-emitting area EA. For example, when green light is output from the light-emitting area EA, the first color filter CF1 may be the green color filter.

In one embodiment of the present invention, the color filters CF1 and CF2 may directly contact at least portions of an upper surface and a side surface of the black matrix BM. For example, the color filters CF1 and CF2 may be disposed directly on the black matrix BM. Alternatively, a material other than a bonding member for bonding the color filters CF1 and CF2 and the black matrix BM is not interposed therebetween.

The first color filter CF1 may allow light emitted from the light-emitting element LED to selectively pass therethrough according to a wavelength or color. When the black matrix BM and the color filters CF1 and CF2 are disposed on the touch sensor layer TSL, external light reflection can be sufficiently prevented without a polarization layer having a thickness of 80 μm or more. In addition, since the black matrix BM and the color filters CF1 and CF2 have a higher transmittance than the polarization layer, contrast and light efficiency can be improved.

In one embodiment of the present invention, the second color filter CF2 may overlap the light-receiving area RA. The second color filter CF2 may be one of a red color filter, a green color filter, and a blue color filter according to color light detected by the light-receiving layer LRL. For example, when the light-receiving layer LRL absorbs light in a green wavelength band, the second color filter CF2 may be the green filter. In other words, the second color filter CF2 may be set irrespective of emission colors of adjacent pixels.

The black matrix BM and the color filters CF1 and CF2 may function as an antireflection layer which blocks external light reflection. Since the display panel 100 includes the black matrix BM and the color filters CF1 and CF2 functioning as an antireflection layer, a separate polarization layer is not included (removed). Accordingly, a decrease in luminance can be prevented, and a thickness of the display panel 100 can be minimized.

In addition, since the light-receiving element LRD is formed to be coplanar with the light-emitting element LED, the thickness of the display panel 100 can be further reduced, and an incident amount of external light to the light-receiving element LRD can be increased to improve light detection performance. In addition, since the sensor circuit SSC is simultaneously formed during a manufacturing process of the pixel circuit PXC, and the light-receiving element LRD is simultaneously formed in a manufacturing process of the light-emitting element LED, thereby reducing a process time and manufacturing costs.

Figure 6:
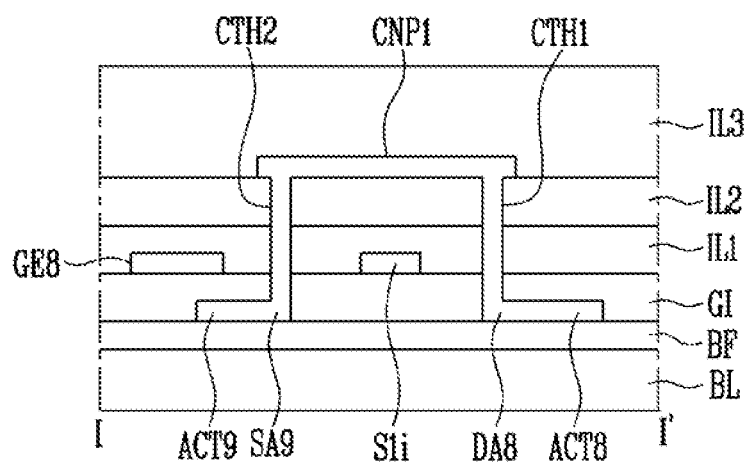
FIG. 6 is a cross-sectional view taken along line I-I' of FIG. 3.

FIG. 6 is a cross-sectional view taken along line I-I' of FIG. 3.

Referring to FIGS. 3, 4A, 4B, 4C, and 6, a first connection pattern CNP1 may connect a first sensor transistor M1 and a second sensor transistor M2.

In one embodiment of the present invention, the first connection pattern CNP1 included in a third conductive layer CL3 may be provided on a second insulating layer IL2. The first connection pattern CNP1 may be connected to a drain area of the first sensor transistor M1 (in other words, an eighth drain area DA8) through a first contact hole CTH1 and may be connected to a source area of the second sensor transistor M2 (in other words, a ninth source area SA9) through a second contact hole CTH2. In this way, the drain area of the first sensor transistor M1 and the source area of the second sensor transistor M2 may be connected to each other. A portion of the first connection pattern CNP1 may overlap a first scan line S1i.

Figure 7:
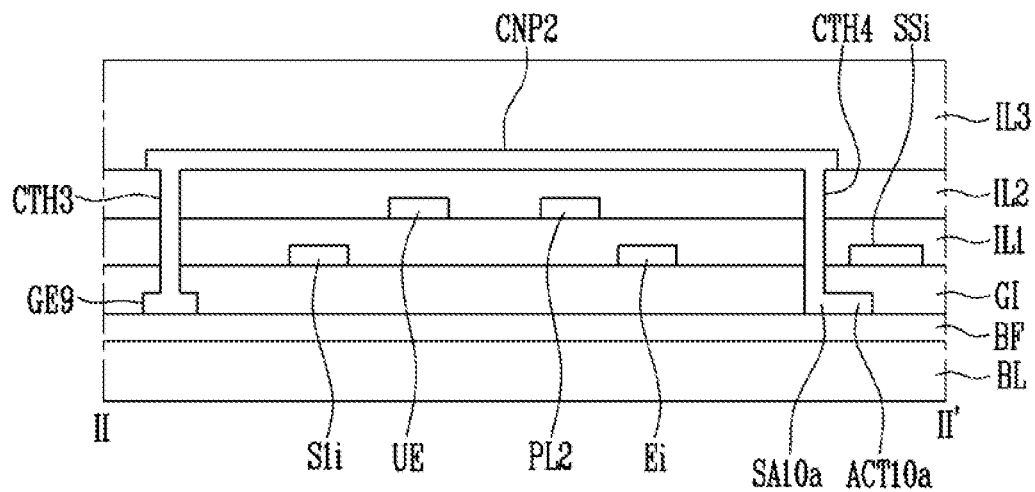
FIG. 7 is a cross-sectional view taken along line II-IF of FIG. 3.

FIG. 7 is a cross-sectional view taken along line II-II' of FIG. 3.

Referring to FIGS. 3, 4A, 4B, 4C, and 7, a second connection pattern CNP2 connected to a previous sensing scan line SSi−1 may be connected to a gate electrode of a second sensor transistor M2 and a third sensor transistor M3.

In one embodiment of the present invention, the second connection pattern CNP2 included in a third conductive layer CL3 may be provided on a second insulating layer IL2. The second connection pattern CNP2 may be connected to a gate electrode of the second sensor transistor M2 (in other words, a ninth gate electrode GE9) through a third contact hole CTH3 and may be connected to a source area of the third sensor transistor M3 (in other words, a $10a^{th}$ source area SA10a) through a fourth contact hole CTH4. A portion of the second connection pattern CNP2 may overlap a first scan line S1i, an emission control line Ei, an upper electrode UE, and a sensing power line PL2. A $10a^{th}$ active pattern ACT10a may overlap a sensing scan line SSi.

According to an embodiment of the present invention, the display device 1000 includes: a base layer BL; a backplane structure BP provided on the base layer BL and including a pixel circuit PXC and a sensor circuit SSC; a pixel layer PXL provided on the backplane structure BP and including a light-emitting element LED connected to the pixel circuit PXC and a light-receiving element LRD connected to the sensor circuit SSC; and an encapsulation layer TFE covering the pixel layer PXL, wherein the sensor circuit SSC includes: a first sensor transistor M1 and a second sensor transistor M2 connected between a readout line RXk and a sensing power line PL2 to which sensing power VDD2 is supplied; and a third sensor transistor M3 connected to the light-receiving element LRD, wherein the sensing power line PL2 extends in a first direction DR1, and wherein the backplane structure BP further includes a first connection pattern CNP1 to connect the first sensor transistor M1 and the second sensor transistor M2 through first and second contact holes CTH1 and CTH2.

Figure 8:
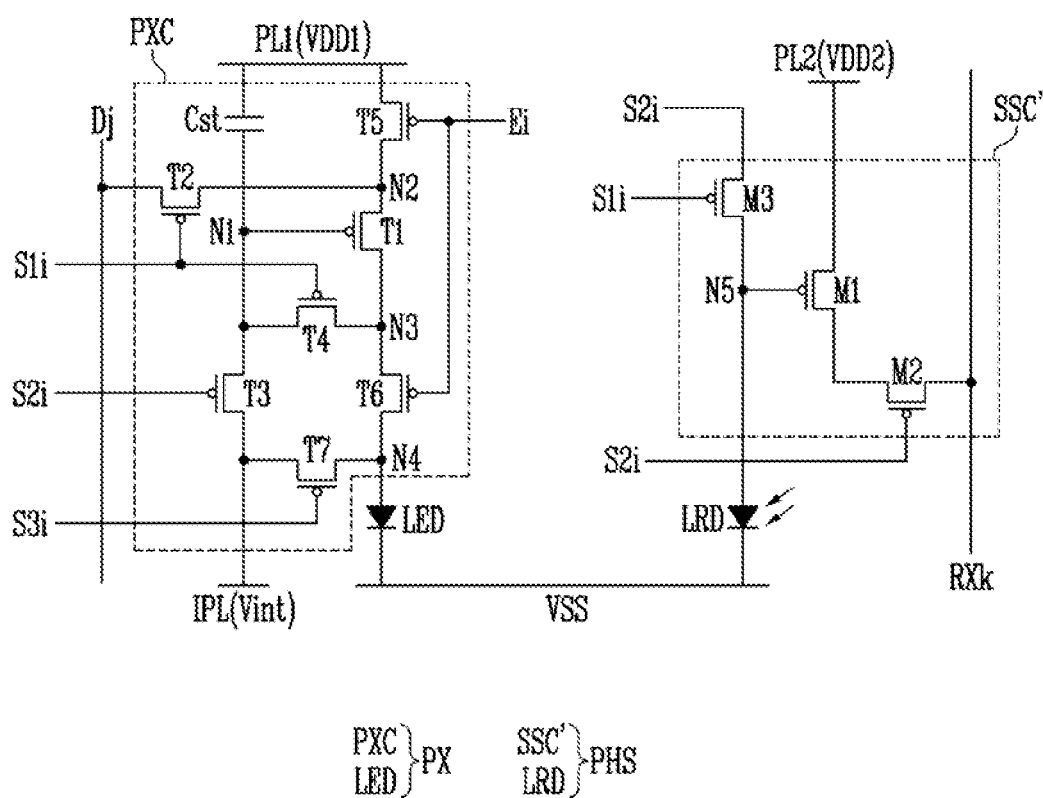
FIG. 8 is a circuit diagram illustrating an example of a pixel and an optical sensor included in the display device of FIG. 1.

FIG. 8 is a circuit diagram illustrating an example of a pixel and an optical sensor included in the display device of FIG. 1.

In FIG. 8, like reference numerals are used to denote components that are the same as those described with reference to FIG. 2, and redundant descriptions of the components will be omitted. In addition, a sensor circuit SSC' of FIG. 8 may have a configuration substantially the same as or similar to that of the sensor circuit SSC of FIG. 2 except for a connection configuration of a third sensor transistor M3 and a connection configuration of a gate electrode of a second sensor transistor M2.

Referring to FIG. 8, a pixel PX may include a pixel circuit PXC and a light-emitting element LED connected thereto, and an optical sensor PHS may include the sensor circuit SSC' and a light-receiving element LRD connected thereto.

Since the pixel PX is substantially the same as the pixel PX described with reference to FIG. 2, redundant descriptions thereof will be omitted.

The sensor circuit SSC' may include a first sensor transistor M1, a second sensor transistor M2, and a third sensor transistor M3.

The first sensor transistor M1 and the second sensor transistor M2 may be connected in series between a sensing power line PL2 and a readout line RXk.

In one embodiment of the present invention, a gate electrode of the second sensor transistor M2 may be connected to a second scan line S2i. For example, the second scan line S2i may be commonly connected to a gate electrode of a third pixel transistor T3 and the gate electrode of the second sensor transistor M2.

In one embodiment of the present invention, the third sensor transistor M3 may be connected between the second scan line S2i and a fifth node N5. Accordingly, the second scan line S2i may be commonly connected to the gate electrode of the third pixel transistor T3, the gate electrode of the second sensor transistor M2, and a first electrode (for example, a source electrode) of the third sensor transistor M3.

In one embodiment of the present invention, the gate electrode of the third sensor transistor M3 may be connected to a first scan line S1i. For example, the first scan line S1i may be commonly connected to a gate electrode of a second pixel transistor T2, a gate electrode of a fourth pixel transistor T4, and the gate electrode of the third sensor transistor M3.

Accordingly, in a backplane structure according to the present embodiment, a sensing scan line SSi may be omitted as compared with FIG. 2.

Figure 9:
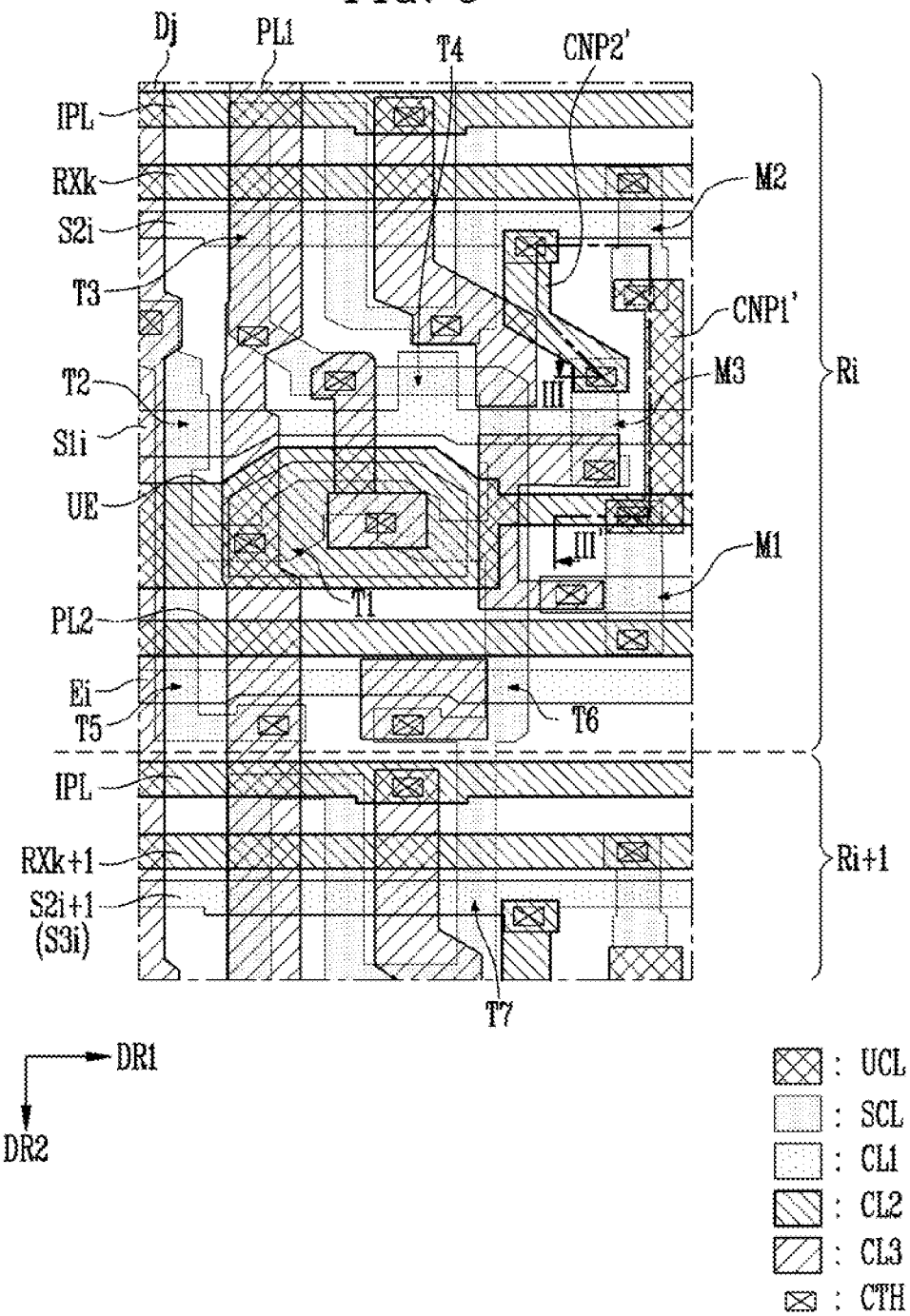
FIG. 9 is a layout view illustrating an example of a backplane structure including a pixel circuit and a sensor circuit of FIG. 8.
Figure 10A:
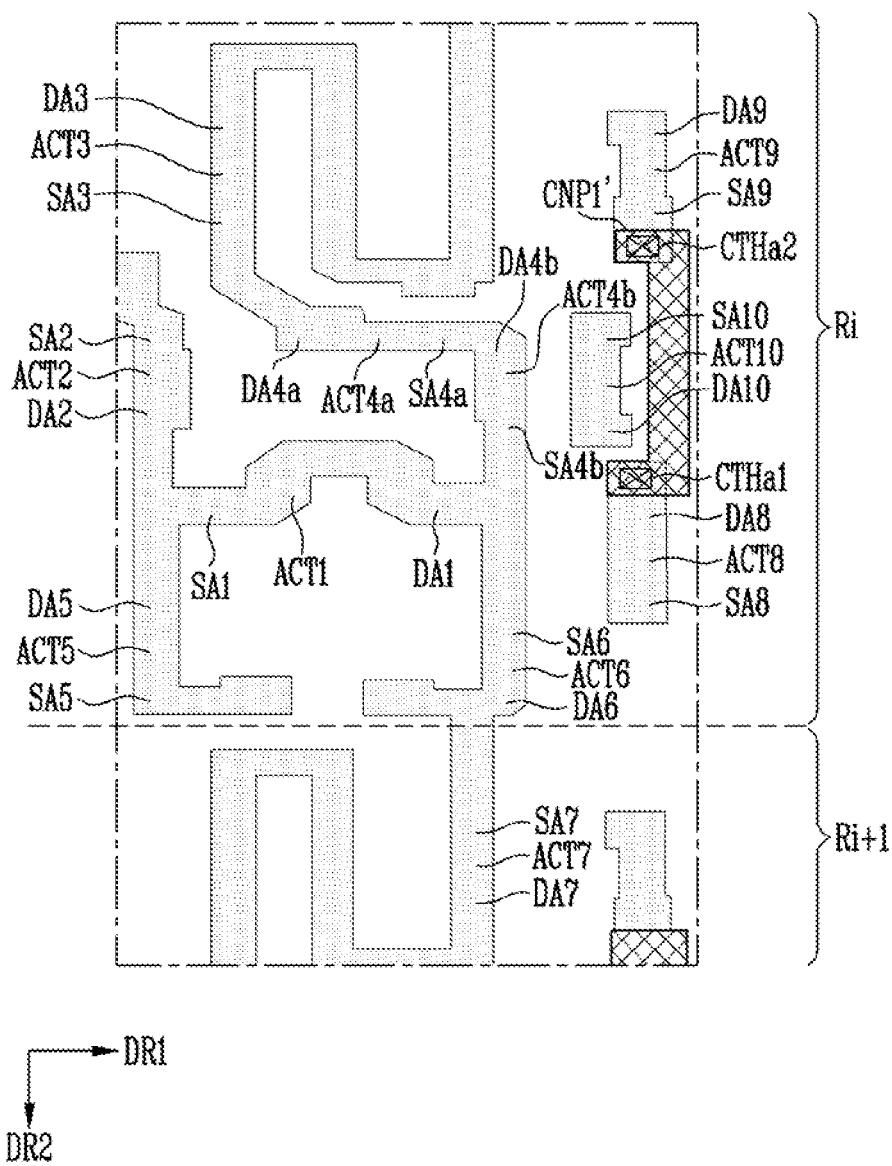
FIG. 10A is a plan view illustrating an example of a lower conductive layer and a semiconductor layer shown in FIG. 9.
Figure 10B:
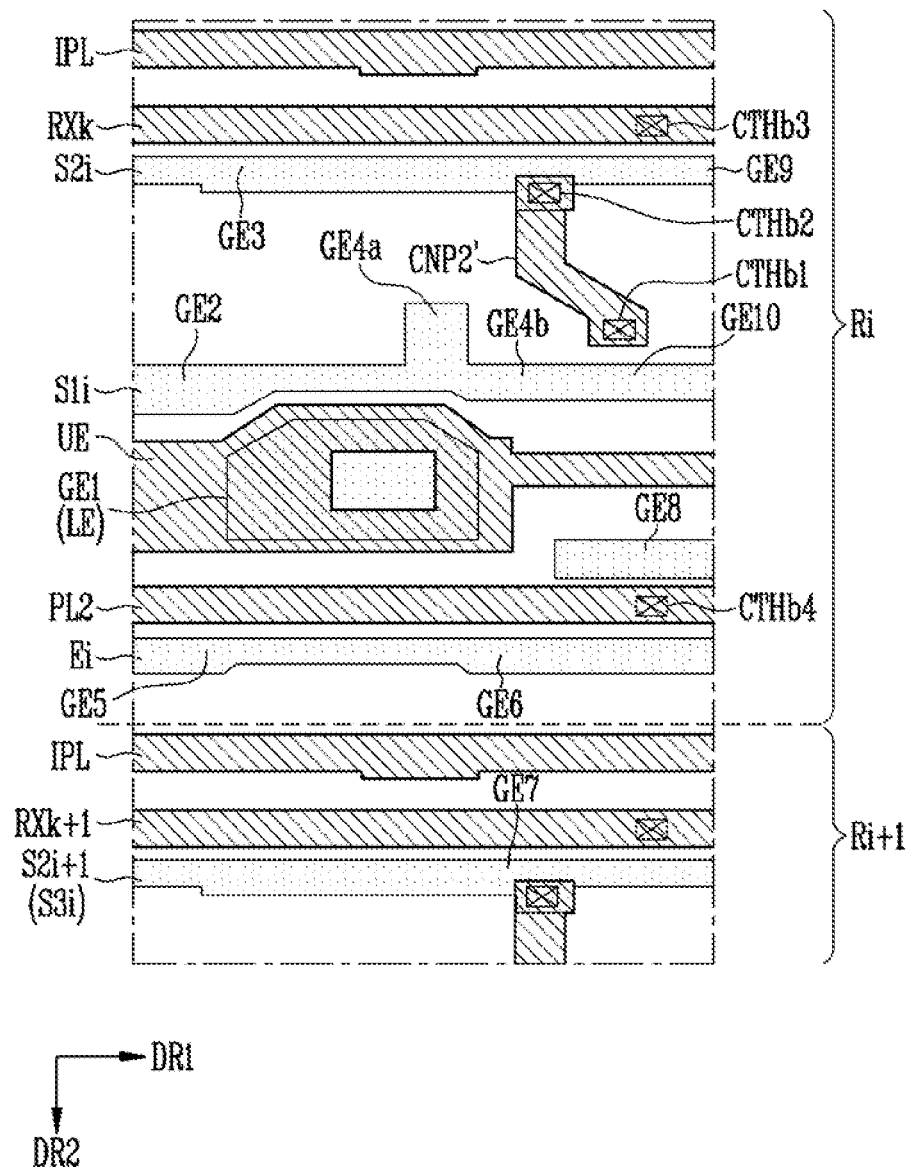
FIG. 10B is a plan view illustrating an example of a first conductive layer and a second conductive layer included in the backplane structure of FIG. 9.

FIG. 9 is a layout view illustrating an example of a backplane structure including the pixel circuit and the sensor circuit of FIG. 8. FIG. 10A is a plan view illustrating an example of a lower conductive layer and a semiconductor layer shown in FIG. 9, FIG. 10B is a plan view illustrating an example of a first conductive layer and a second conductive layer included in the backplane structure of FIG. 9, and FIG. 10C is a plan view illustrating an example of a third conductive layer included in the backplane structure of FIG. 9.

Figure 10C:
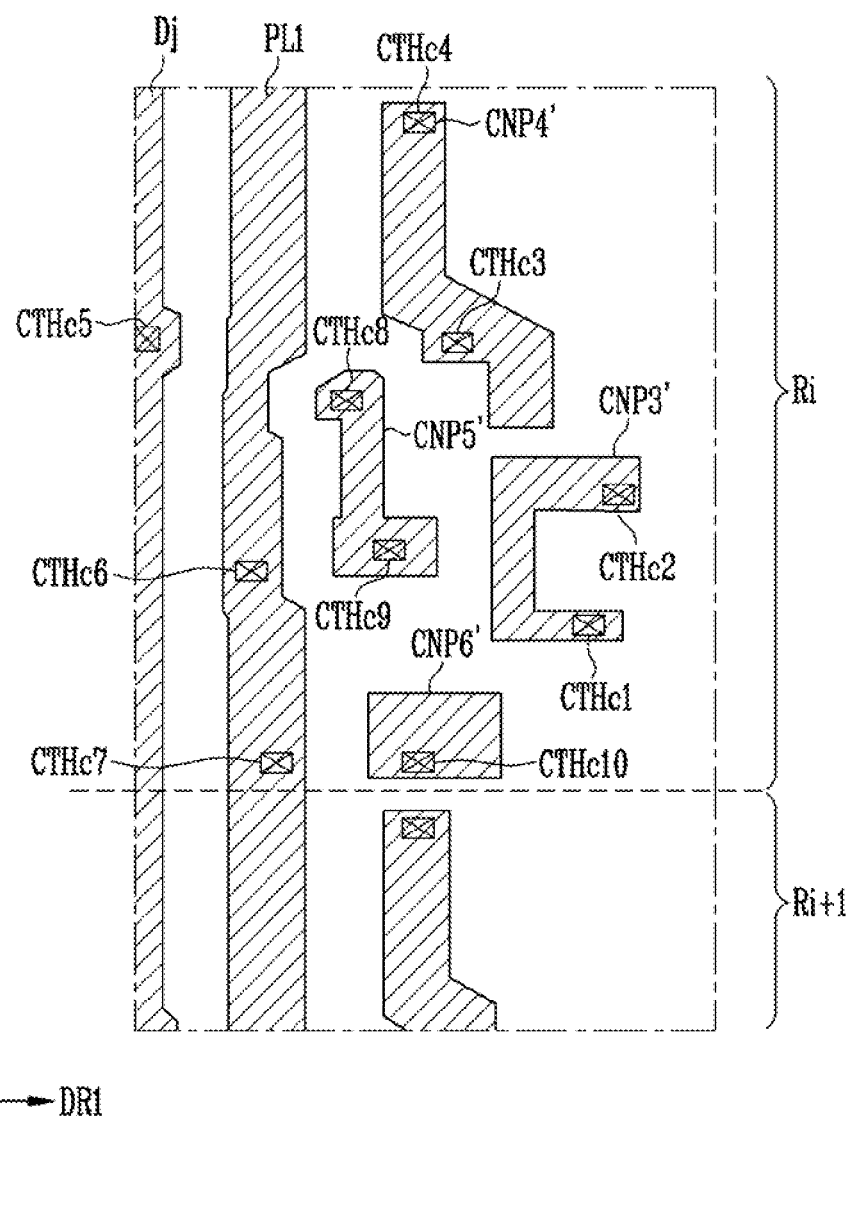
FIG. 10C is a plan view illustrating an example of a third conductive layer included in the backplane structure of FIG. 9.

In FIGS. 9 to 10C, like reference numerals are used to denote components that are the same as those described with reference to FIGS. 3 to 4C, and redundant descriptions of the components will be omitted.

Referring to FIGS. 8, 9, 10A, 10B, and 10C, the backplane structure includes a pixel circuit PXC and a sensor circuit SSC' and may include various signal lines connected thereto.

In one embodiment of the present invention, a seventh pixel transistor T7 may be disposed in an $(i+1)^{th}$ pixel row Ri+1.

A lower conductive layer UCL, a semiconductor layer SCL, a first conductive layer CL1, a second conductive layer CL2, and a third conductive layer CL3 may be sequentially stacked on a base layer with predetermined insulating layers interposed therebetween.

A shown in FIGS. 9 and 10A, the semiconductor layer SCL may be disposed on a buffer layer (denoted by BF in FIG. 5). The semiconductor layer SCL may include active patterns ACT1, ACT2, ACT3, ACT4a, ACT4b, ACT5, ACT6, ACT7, ACT8, ACT9, and ACT10, source areas SA1, SA2, SA3, SA4a, SA4b, SA5, SA6, SA7, SA8, SA9, and SA10, and drain areas DA1, DA2, DA3, DA4a, DA4b, DA5, DA6, DA7, DA8, DA9, and DA10.

In one embodiment of the present invention, to prevent/minimize a leakage current, a fourth pixel transistor T4 may have a dual gate structure in which sub-transistors are connected in series.

In one embodiment of the present invention, the lower conductive layer UCL may be disposed between the semiconductor layer SCL and the buffer layer BF. The lower conductive layer UCL may be made of a metal. For example, the metal may include at least one selected from metals such as gold (Au), silver (Ag), aluminum (Al), molybdenum (Mo), chromium (Cr), titanium (Ti), nickel (Ni), neodymium (Nd), and copper (Cu), or an alloy of the metals. In addition, the first conductive layer CL1 may be formed as a single layer or a multi-layer in which two or more materials selected from metals and alloys are stacked.

In one embodiment of the present invention, the lower conductive layer UCL may include a first connection pattern CNP1'. The first connection pattern CNP1' may extend in a second direction DR2.

The first connection pattern CNP1' may connect a first sensor transistor M1 and a second sensor transistor M2 under the semiconductor layer SCL. The first connection pattern CNP1' may be connected to an eighth drain area DA8 and a ninth source area SA9. To accomplish this, the semiconductor layer SCL may include a first lower contact hole CTHa1 connected to the first connection pattern CNP1' in the eighth drain area DA8 and a second lower contact hole CTHa2 connected to the first connection pattern CNP1' in the ninth source area SA9. Accordingly, the first connection pattern CNP1 may electrically connect the first sensor transistor M1 and the second sensor transistor M2.

The first conductive layer CL1 may be formed on a gate insulating layer covering at least a portion of the semiconductor layer SCL. As shown in FIGS. 9 and 10B, the first conductive layer CL1 may include first to tenth gate electrodes GE1, GE2, GE3, GE4a, GE4b, GE5, GE6, GE7, GE8, GE9, and GE10, a lower electrode LE of a storage capacitor Cst, a first scan line S1$i$, a second scan line S2$i$, a third scan line S3$i$, and an emission control line Ei.

The first scan line S1$i$, the second scan line S2$i$, the third scan line S3$i$, and the emission control line Ei may extend in a first direction DR1.

In an embodiment of the present invention, the ninth gate electrode GE9 may be part of the second scan line S2$i$, and the tenth gate electrode GE10 may be part of the first scan line S1$i$. The eighth gate electrode GE8 may be a pattern having an island shape.

Accordingly, an interconnection structure of the first conductive layer CL1 may be simplified.

The second conductive layer CL2 may be formed on a first insulating layer covering the first conductive layer CL1. As shown in FIGS. 9 and 10B, the second conductive layer CL2 may include an initialization power line IPL, a readout line RXk, an upper electrode UE of the storage capacitor Cst, a sensing power line PL2, and a second connection pattern CNP2'. In one embodiment of the present invention, the initialization power line IPL, the readout line RXk, the upper electrode UE of the storage capacitor Cst, the sensing power line PL2, and second connection pattern CNP2' may be formed to be coplanar with each other using the same material and process. In one embodiment of the present invention, the first conductive layer CL1 may include first, second, third and fourth intermediate contact holes CTHb1, CTHb2, CTHb3 and CTHb4.

The initialization power line IPL and the sensing power line PL2 may extend in the first direction DR1. In one embodiment of the present invention, the readout line RXk may extend in the first direction DR1.

The readout line RXk may be connected to the second sensor transistor M2. In one embodiment of the present invention, the readout line RXk may be connected to a ninth drain area DA9 (in other words, a drain area of the second sensor transistor M2) through the third intermediate contact hole CTHb3.

The sensing power line PL2 may be connected to the first sensor transistor M1. In one embodiment of the present invention, the sensing power line PL2 may be connected to an eighth source area SA8 (in other words, a source area of the first sensor transistor M1) through the fourth intermediate contact hole CTHb4.

The second connection pattern CNP2' may be connected to the second scan line S2$i$ and a third sensor transistor M3. In one embodiment of the present invention, the second connection pattern CNP2' may be connected to a first source area SA10 (in other words, a source area of the third sensor transistor M3) through the first intermediate contact hole CTHb1 and may be connected to the second scan line S2$i$ through the intermediate contact hole CTHb2. Accordingly, a second scan signal may be provided to the third sensor transistor M3.

The third conductive layer CL3 may be formed on a second insulating layer covering at least a portion of the second conductive layer CL2. As shown in FIGS. 9 and 10C, the third conductive layer CL3 may include a data line Dj and a driving power line PL1. The third conductive layer CL3 may further include third, fourth, fifth and sixth connection patterns CNP3', CNP4', CNP5' and CNP6'. In one embodiment of the present invention, the data line Dj, the driving power line PL1, and the third to sixth connection patterns CNP3' to CNP6' may be formed to be coplanar with each other using the same material and process. The third conductive layer CL3 may be connected to components thereunder through first, second, third, fourth, fifth, sixth, seventh, eighth, ninth and tenth upper contact holes CTHc1, CTHc2, CTHc3, CTHc4, CTHc5, CTHc6, CTHc7, CTHc8, CTHc9 and CTHc10.

The third to sixth connection patterns CNP3' to CNP6' may each be formed in an island shape and may electrically interconnect predetermined lower components through contact holes.

The third connection pattern CNP3' may be used to form the sensor circuit SSC'. The third connection pattern CNP3' may electrically connect the third sensor transistor M3 and a gate electrode of the first sensor transistor M1. The third connection pattern CNP3' may correspond to a fifth node N5. For example, the third connection pattern CNP3' may be connected to the eighth gate electrode GE8 through the first upper contact hole CTHc1 and may be connected to a tenth drain area DA10 through the second upper contact hole CTHc2.

In addition, the third connection pattern CNP3' may be connected to a first sensor electrode of a light-receiving element LRD through a contact hole formed thereon.

The driving power line PL1 may be connected to the upper electrode UE through the sixth upper contact hole CTHc6 and may be connected to a fifth source area SA5 through the seventh upper contact hole CTHc7. Accordingly, a voltage of a driving power supply VDD1 may be supplied to one electrode (e.g., the upper electrode UE) of the storage capacitor Cst and a fifth pixel transistor T5.

The data line Dj may be connected to a second source area SA2 through the fifth upper contact hole CTHc5. Accordingly, a data signal may be provided to a second pixel transistor T2.

A fourth connection pattern CNP4' may electrically connect the initialization power line IPL and a third pixel transistor T3. For example, the fourth connection pattern CNP4' may be connected to the initialization power line IPL through the fourth upper contact hole CTHc4 and may be connected to a third drain area DA3 through the third upper contact hole CTHc3.

A fifth connection pattern CNP5' may connect the third pixel transistor T3 and a gate electrode of a first pixel transistor T1. For example, the fifth connection pattern CNP5' may be connected to a third source area SA3 through the eighth upper contact hole CTHc8 and may be connected to the first gate electrode GE1 through the ninth upper contact hole CTHc9. The ninth upper contact hole CTHc9 may pass through an opening of the upper electrode UE.

A sixth connection pattern CNP6' may be connected to a sixth pixel transistor T6 and the seventh pixel transistor T7. The sixth connection pattern CNP6' may be connected to a sixth drain area DA6 and a seventh source area SA7 through the tenth contact hole CTHc10. In addition, the sixth connection pattern CNP6' may be connected to a first pixel electrode of a light-emitting element LED through a contact hole formed thereon.

As described above, according to embodiments of the present invention, a display device 1000, in which a pixel PX and an optical sensor PHS are formed through the same process, may include the pixel circuit PXC and the sensor circuit SSC', which share the scan lines S1$i$ and S2$i$, and the first connection pattern CNP1' formed of the lower conductive layer UCL. Accordingly, as compared with the embodiment of FIG. 2, a decrease in pixel per inch (PPI) can be minimized, and the present embodiment can be relatively easily applied to a design of a high-resolution display device.

FIG. 11 is a cross-sectional view taken along line of FIG. 9.

Referring to FIGS. 8, 9, 10A, 10B, 10C, and 11, a first connection pattern CNP1' may connect a first sensor transistor M1 and a second sensor transistor M2, and a second connection pattern CNP2' may connect a second scan line S2$i$ and a third sensor transistor M3. The first connection pattern CNP1' may be provided on the base layer BL under the buffer layer BF and the second connection pattern CNP2' may be provided on the first insulating layer IL1.

In an embodiment of the present invention, the first connection pattern CNP1' may be provided under a semiconductor layer SCL as a lower conductive layer UCL. The first connection pattern CNP1' may be connected to a drain area of a first sensor transistor M1 (in other words, an eighth drain area DA8) through a first lower contact hole CTHa1 and may be connected to a source area of a second sensor transistor M2 (in other words, a ninth source area SA9) through a second lower contact hole CTHa2. The first and second lower contact holes CTHa1 and CTHa2 may be formed through the buffer layer BF. A portion of the first connection pattern CNP1' may overlap a first scan line S1$i$.

In one embodiment of the present invention, the second connection pattern CNP2' may be included in a second conductive CL2. The second connection pattern CNP2' may be connected to a source area of a third sensor transistor M3 (in other words, a tenth source area SA10) through a first intermediate contact hole CTHb1 and may be connected to a second scan line S2$i$ through a second intermediate contact hole CTHb2. The first intermediate contact hole CTHb1 may be formed through the first insulating layer IL1 and the gate insulating layer GI. The second intermediate contact hole CTHb2 may be formed through the first insulating layer IL1, FIG. 12 is a view illustrating an example of an arrangement of a pixel and optical sensors included in the display device of FIG. 1, and FIG. 13 is a view illustrating an example of an arrangement of a pixel and optical sensors included in the display device of FIG. 1.

Referring to FIGS. 1, 12, and 13, pixels R_PX, B_PX, and G_PX and optical sensors PHS1, PHS2, PHS3 and PHS4 may be disposed in a display area AA of a display panel 100.

For convenience of description, it may be understood that the pixels R_PX, B_PX, and G_PX and the optical sensors PHS1 to PHS4 of FIGS. 12 and 13 are illustrated by simplifying positions at which a pixel circuit and a sensor circuit are formed.

An arrangement of a red pixel R_PX and a green pixel G_PX in a first direction DR1 may be repeated in an $i^{th}$ pixel row Ri (wherein i is a natural number). In this case, an arrangement of a blue pixel B_RX and a green pixel G_PX in the first direction DR1 may be repeated in pixel rows vertically adjacent to the $i^{th}$ pixel row Ri.

In one embodiment of the present invention, a ratio of the number of the pixel circuits to the number of the sensor circuits may be 1:1. In other words, as shown in FIG. 12, a ratio of the number of the pixels R_PX, B_PX, and G_PX to the number of the optical sensors PHS1 to PHS4 may be 1:1.

For example, in the $i^{th}$ pixel row Ri, the red pixel R_PX, a first optical sensor PHS1, the green pixel G_PX, a second optical sensor PHS2, the red pixel R_PX, a third optical sensor PHS3, the green pixel G_PX, and a fourth optical sensor PHS4 may be sequentially arranged in the first direction DR. Each of the first to fourth optical sensors PHS1 to PHS4 may detect a light amount of one of red light, green light, blue light, and white light.

In one embodiment of the present invention, a ratio of the number of the pixel circuits to the number of the sensor circuits may be 2:1. In other words, as shown in FIG. 13, a ratio of the number of the pixels R_PX, B_PX, and G_PX to the number of the light sensors PHS1 to PHS4 may be 2:1.

For example, in the $i^{th}$ pixel row Ri, the red pixel R_PX, the green pixel G_PX, the first optical sensor PHS1, the red pixel R_PX, the green pixel G_PX, and the second optical sensor PHS2 may be sequentially arranged in the first direction DR1. Each of the first and second optical sensors PHS1 and PHS2 may detect a light amount of one of red light, green light, blue light, and white light. In the embodiment of FIG. 13, a higher PPI may be secured as compared with the embodiment of FIG. 12.

However, this is merely an example, and an arrangement relationship between the pixel and the optical sensor is not limited thereto, and various positional relationships or number ratios may be designed according to the purpose of the display device.

As described above, in a display device including an optical sensor integrated in a display panel and a method of manufacturing the same according to embodiments of the present invention, a sensing power line, a sensing scan line, and a readout line each extending in a first direction may be provided on a first insulating layer, and a first connection pattern and a second connection pattern each extending in a second direction may be provided on a second insulating layer. Thus, a sensor circuit occupying a relatively small space can be formed simultaneously with a pixel circuit in a manufacturing process of the pixel circuit without an additional mask and an additional process. Accordingly, it is possible to reduce a thickness of the display device including the optical sensor while reducing a process time and manufacturing costs. In addition, while a reduction in PPI is minimized, a thin display device is implemented to be easily applied to electronic devices in various fields, such as a high-resolution display device and a wearable device requiring a thin thickness.

Although the present invention has been described with reference to embodiments thereof, those skilled in the art will appreciate that various modifications and variations can be made in the present invention without departing from the spirit or scope of the invention set forth in the appended claims.

What is claimed is:

1. A display device, comprising:
   a base layer;
   a backplane structure provided on the base layer and including a pixel circuit and a sensor circuit;
   a pixel layer provided on the backplane structure and including a light-emitting element connected to the pixel circuit and a light-receiving element connected to the sensor circuit, wherein the light-emitting element includes a light-emitting diode, and the light-receiving element includes a photo sensor; and
   an encapsulation layer covering the pixel layer,
   wherein the backplane structure is disposed between the base layer and the pixel layer,
   wherein the sensor circuit includes:
   a first sensor transistor and a second sensor transistor connected between a readout line and a sensing power line to which sensing power is supplied; and
   a third sensor transistor connected to the light-receiving element,
   wherein the readout line and the sensing power line extend in a first direction directly on a first insulating layer,
   wherein the backplane structure further includes a first connection pattern to electrically connect the first sensor transistor and the second sensor transistor through first and second contact holes, wherein the first connection pattern extends in a second direction intersecting the first direction, wherein the first connection pattern is disposed directly on a second insulating layer disposed above the first insulating layer, and wherein the second insulating layer is disposed between the first connection pattern and the first insulating layer, and
   wherein an uppermost surface of the first connection pattern from the base layer is greater than an uppermost surface of the readout line and the sensing power line from the base layer.

2. The display device of claim 1, wherein the backplane structure further includes:
   a semiconductor layer including an active pattern provided on the base layer;
   a first conductive layer including gate electrodes overlapping the active pattern with a gate insulating layer interposed therebetween;
   the first insulating layer covering the first conductive layer;
   a second conductive layer provided on the first insulating layer; and
   the second insulating layer covering the second conductive layer.

3. The display device of claim 2, wherein the second conductive layer includes the sensing power line and the readout line.

4. The display device of claim 3, wherein the second conductive layer further includes an initialization power line which extends in the first direction and provides initialization power to the pixel circuit.

5. The display device of claim 2, wherein the first conductive layer further includes:
   a sensing scan line extending in the first direction from a gate electrode of the second sensor transistor; and
   a scan line connected to the pixel circuit and extending in the first direction.

6. The display device of claim 3, wherein the backplane structure further includes:
   a third conductive layer provided on the second insulating layer and connected to at least one of the semiconductor layer, the first conductive layer, and the second conductive layer through a contact hole.

7. The display device of claim 6, wherein the third conductive layer includes the first connection pattern.

8. The display device of claim 7, wherein the third conductive layer further includes a second connection pattern connected to a previous sensing scan line and the third sensor transistor through third and fourth contact holes and extending in the second direction.

9. The display device of claim 8, wherein the second connection pattern is further connected to a gate electrode of the second sensor transistor through a contact hole.

10. The display device of claim 6, wherein the third conductive layer further includes:
    a driving power line which extends in a second direction intersecting the first direction and provides a voltage of a driving power supply to the pixel circuit, and
    a data line which extends in the second direction and provides a data signal to the pixel circuit.

11. The display device of claim 6, wherein the backplane structure further includes:
    a lower conductive layer provided on the base layer; and
    a buffer layer provided between the lower conductive layer and the semiconductor layer to cover the lower conductive layer.

12. The display device of claim 11, wherein the lower conductive layer includes the first connection pattern extending in a second direction intersecting the first direction.

13. The display device of claim 11, wherein the first conductive layer further includes:
    a first scan line extending in the first direction and connected to a gate electrode of the third sensor transistor and the pixel circuit; and
    a second scan line extending in the first direction and connected to a gate electrode of the second sensor transistor and the pixel circuit.

14. The display device of claim 13, wherein the second conductive layer includes:
    a second connection pattern connected to the second scan line and the third sensor transistor through third and fourth contact holes and including a portion extending in the second direction.

15. The display device of claim 14, wherein a scan signal is supplied to a gate electrode of the first sensor transistor and a first electrode of the third sensor transistor through the second scan line.

16. The display device of claim 3, wherein the pixel circuit includes:
    a first pixel transistor configured to receive a voltage of a driving power supply from a driving power line and generate a driving current to be supplied to the light-emitting element;
    a second pixel transistor connected between a data line and a first electrode of the first pixel transistor and including a gate electrode connected to a first scan line;
    a third pixel transistor connected between a gate electrode of the first pixel transistor and an initialization power line and including a gate electrode connected to a second scan line; and a fourth pixel transistor connected between a first electrode of the light-emitting element and the initialization power line and including a gate electrode connected to a third scan line, wherein the first scan line is connected to the gate electrode of the third sensor transistor and the gate electrode of the second pixel transistor.

17. The display device of claim 16, wherein the second scan line is connected to the gate electrode of the second sensor transistor and the gate electrode of the third pixel transistor and is connected to a first electrode of the third sensor transistor through a second connection pattern.

18. The display device according to claim 2, wherein, in one pixel row, a ratio of a number of the pixel circuits to a number of the sensor circuits is 1:1.

19. The display device according to claim 2, wherein, in one pixel row, a ratio of the number of the pixel circuits to the number of the sensor circuits is 2:1.

* * * * *